(12) United States Patent
Shimizu et al.

(10) Patent No.: US 7,642,499 B2
(45) Date of Patent: Jan. 5, 2010

(54) IMAGE SENSOR COMPRISING MULTILAYER WIRE

(75) Inventors: Ryu Shimizu, Mizuho (JP); Masahiro Oda, Itami (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 12/023,721

(22) Filed: Jan. 31, 2008

(65) Prior Publication Data

US 2008/0179495 A1 Jul. 31, 2008

(30) Foreign Application Priority Data

Jan. 31, 2007 (JP) .............................. 2007-022371

(51) Int. Cl.
*H01L 27/00* (2006.01)
*H04N 3/14* (2006.01)

(52) U.S. Cl. ................ 250/208.1; 348/311; 257/E27.15

(58) Field of Classification Search .............. 250/208.1; 348/311, 312; 257/223, E27.15

See application file for complete search history.

(56) References Cited

U.S. PATENT DOCUMENTS

| 6,862,333 B2 * | 3/2005 | Kashima et al. ................ 377/60 |
| 2006/0128149 A1 * | 6/2006 | Kim ............................ 438/669 |

FOREIGN PATENT DOCUMENTS

JP 7-176721 7/1995

OTHER PUBLICATIONS

Sudhir K. Madan, et al., "Experimentl Observation of Avalanche Multiplication in Charge-Coupled Devices," IEEE Transactions on Electron Devices, Jun. 1983, pp. 694-699, vol. ED-30, No. 6, IEEE.

* cited by examiner

*Primary Examiner*—Thanh X Luu
(74) *Attorney, Agent, or Firm*—Ditthavong, Mori & Steiner, P.C.

(57) ABSTRACT

This image sensor includes a charge increasing portion for increasing the quantity of charges, a first electrode for applying a voltage regulating a region adjacent to the charge increasing portion to a prescribed potential, a second electrode provided adjacently to the first electrode for applying another voltage increasing the quantity of charges in the charge increasing portion, a first wire formed on a prescribed layer for supplying a signal to the first electrode and a second wire formed on a layer different from the prescribed layer for supplying another signal to the second electrode.

21 Claims, 20 Drawing Sheets

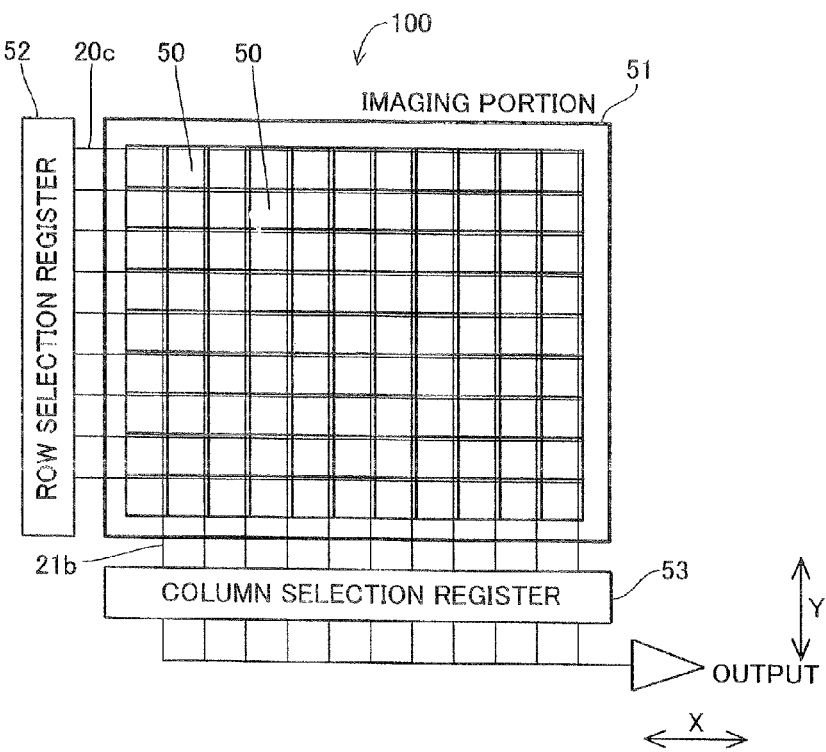
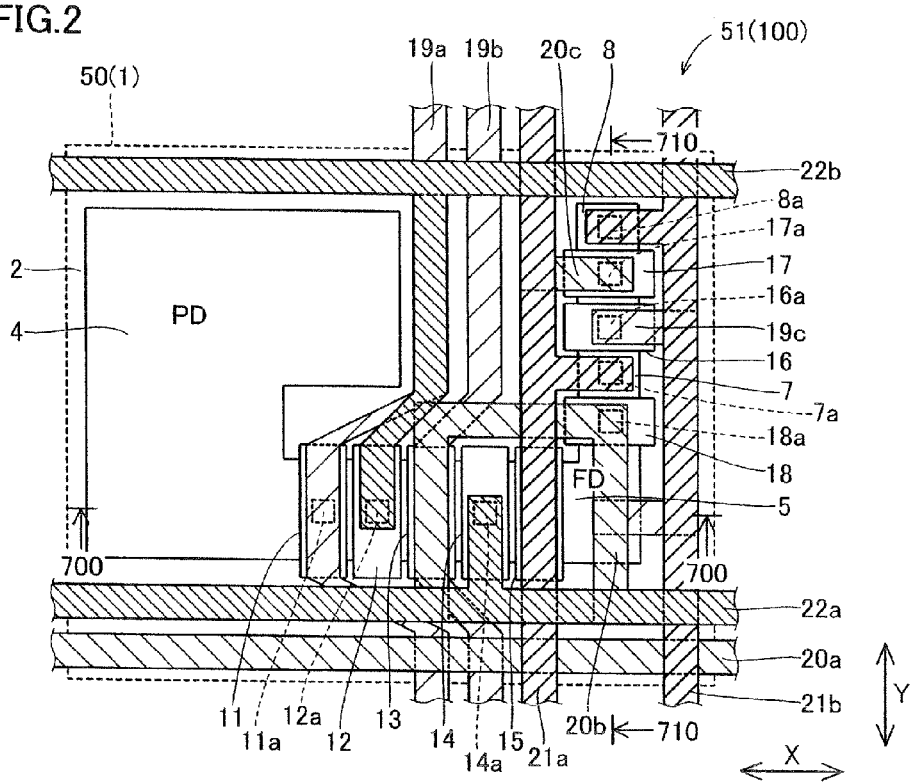

IMAGE SENSOR COMPRISING MULTILAYER WIRE

CROSS-REFERENCE TO RELATED APPLICATION

The priority application number JP2007-22371, image sensor, Jan. 31, 2007, Ryu Shimizu, Masahiro Oda, upon which this patent application is based is hereby incorporated by reference.

BACKGROUND OF THE INVENTION

1. Field of the Invention

The present invention relates to an image sensor.

2. Description of the Background Art

A CCD (charge-coupled device) image sensor comprising a multiplier (charge increaser) multiplying (increasing the quantity of) electrons (charges) is known in general.

In such a conventional multiplier CCD image sensor, a gate oxide film 502 is formed on the surface of a silicon substrate 501, as shown in FIG. 25. Four gate electrodes 503 to 506 are formed on a prescribed region of the upper surface of the gate oxide film 502 at prescribed intervals. The gate electrodes 503 to 506 are supplied with four-phase clock signals $\phi 11$ to $\phi 14$ respectively.

A pixel separation barrier, a temporary storage well, a charge transfer barrier and a charge accumulation well are formed in portions of a transfer channel 507 located under the gate electrodes 503 to 506 respectively. The pixel separation barrier has a function of dividing the temporary storage well from a charge accumulation well of an adjacent pixel while transferring electrons from the adjacent charge accumulation well to the temporary storage well. The temporary storage well temporarily has a function of temporarily storing the electrons transferred thereto. The charge transfer barrier has a function of dividing the temporary storage well and the charge accumulation well from each other while transferring the electrons stored in the temporary storage well to the charge accumulation well.

The charge accumulation well has a function of accumulating the electrons transferred from the temporary storage well, and also functions as a multiplier for multiplying the electrons by collisional ionization caused by an electric field. In other words, a high-field region 508 regulated to a high potential is formed on the interface between the charge transfer barrier and the charge accumulation well, thereby supplying energy to electrons transferred thereto. The electrons supplied with energy collide with atoms in a silicon substrate 501 during transition through the high-field region 508, thereby forming electrons and holes. Among the generated electrons and holes, only the electrons are accumulated in the charge accumulation well due to the electric field in the high-field region 508. Thus, the electrons are multiplied. The conventional multiplier CCD image sensor multiplies the electrons in a process of transferring electrons generated by a photodiode of a photoreceiving region.

The multiplying operation of the conventional multiplier CCD image sensor is now described with reference to FIG. 25.

First, a high-level clock signal $\phi 11$ is supplied to turn on the gate electrode 503, and the gate electrode 506 of the adjacent pixel is thereafter turned off. Thus, electrons stored in the charge accumulation well of the adjacent pixel are transferred to the pixel separation barrier.

Then, a high-level clock signal $\phi 12$ is supplied to the gate electrode 504 for turning on the gate electrode 504, and a low-level clock signal $\phi 11$ is thereafter supplied to the gate electrode 503 for turning off the gate electrode 503. Thus, the electrons transferred to the pixel separation barrier are transferred to the temporary storage well.

Then, a high-level clock signal $\phi 14$ is supplied to the gate electrode 506 for turning on the gate electrode 506. Thus, a high voltage is applied to the gate electrode 506, for forming the high-field region 508 on the interface between the charge transfer barrier and the charge accumulation well. Thereafter a low-level clock signal $\phi 12$ is supplied to the gate electrode 504 for turning off the gate electrode 504 while keeping the gate electrode 506 in the ON-state, thereby transferring the electrons stored in the temporary storage well to the charge accumulation well over the charge transfer barrier Thus, the transferred electrons are multiplied by collisional ionization caused by a high electric field, and the multiplied electrons are stored in the charge accumulation well. The gate electrode 505 is supplied with clock signal $\phi 13$ of a constant voltage, and the charge transfer barrier is regulated to a prescribed potential and kept constant.

SUMMARY OF THE INVENTION

An image sensor according to a first aspect of the present invention comprises a charge increasing portion for increasing the quantity of charges, a first electrode for applying a voltage regulating a region adjacent to the charge increasing portion to a prescribed potential, a second electrode provided adjacently to the first electrode for applying another voltage increasing the quantity of charges in the charge increasing portion, a first wire formed on a prescribed layer for supplying a signal to the first electrode and a second wire formed on a layer different from the prescribed layer for supplying another signal to the second electrode. The charges in the present invention mean electrons or holes.

An image sensor according to a second aspect of the present invention comprises charge increasing means for increasing the quantity of charges, a first electrode for applying a voltage regulating a region adjacent to the charge increasing means to a prescribed potential, a second electrode provided adjacently to the first electrode for applying another voltage increasing the quantity of charges in the charge increasing means, a first wire formed on a prescribed layer for supplying a signal to the first electrode and a second wire formed on a layer different from the prescribed layer for supplying another signal to the second electrode. The charges in the present invention mean electrons or holes.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a plan view showing the overall structure of a CMOS image sensor according to a first embodiment of the present invention;

FIG. 2 is a plan view showing the structure of the CMOS image sensor according to the first embodiment;

DESCRIPTION OF THE PREFERRED EMBODIMENTS

Figure 3:
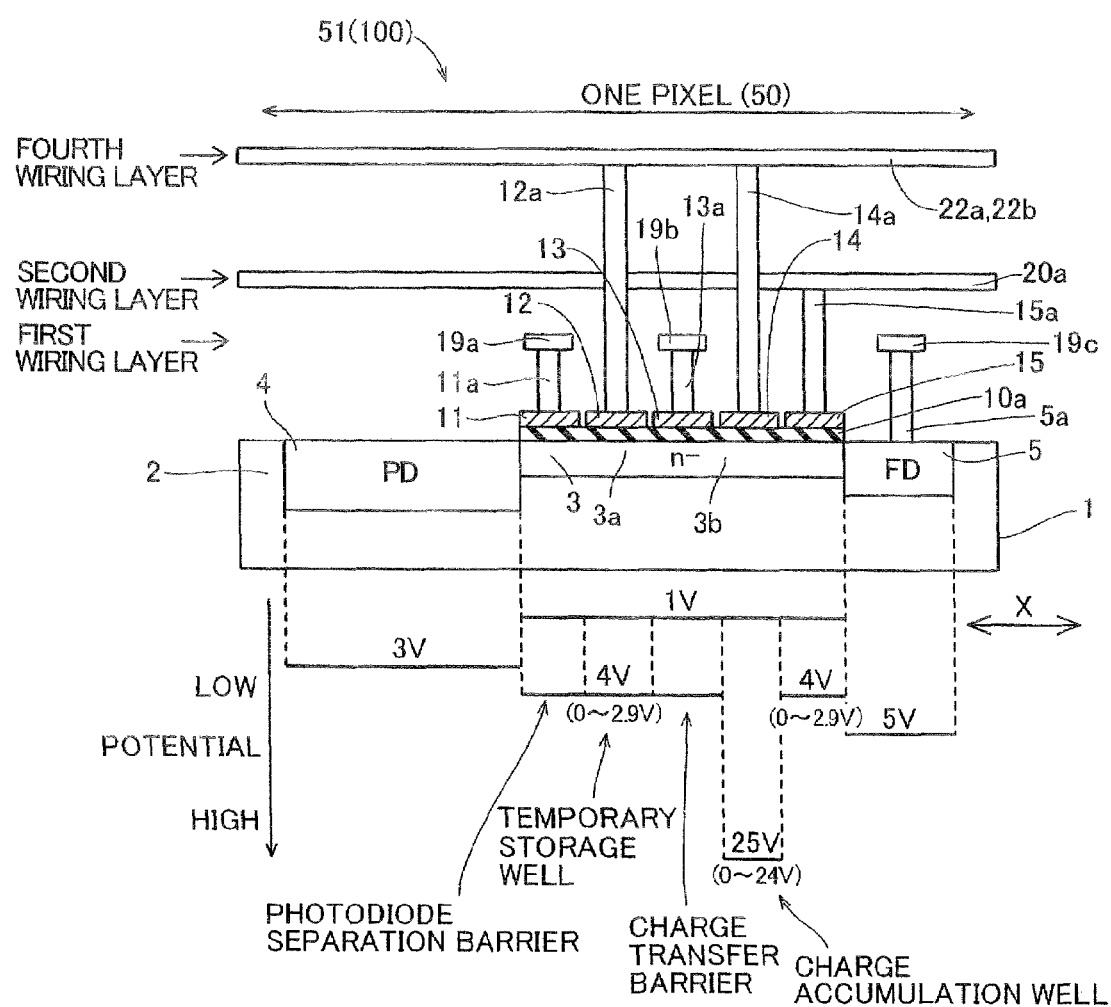
FIG. 3 is a sectional view taken along the line 700-700 in FIG. 2.

Embodiments of the present invention are now described with reference to the accompanying drawings. In each of the following embodiments, the present invention is applied to a CMOS image sensor employed as an exemplary image sensor.

First Embodiment

First, the structure of a CMOS image sensor 100 according to a first embodiment of the present invention is described with reference to FIGS. 1 to 8.

As shown in FIG. 1, the CMOS image sensor 100 according to the first embodiment comprises an imaging portion 51 including a plurality of pixels 50 arranged in the form of a matrix (rows and columns), a row selection register 52 and a column selection register 53.

Referring to the structure of each pixel 50 of the CMOS image sensor 100 according to the first embodiment, an element isolation region 2 is formed on the surface of a p-type silicon substrate 1 for isolating the pixel 50 from adjacent pixels 50, as shown in FIGS. 2 and 3. On the surface portion of the p-type silicon substrate 1 provided with each pixel 50 and enclosed with the element isolation region 2, a photodiode portion (PD) 4 and a floating diffusion region (FD) 5 consisting of an $n^+$-type impurity region are formed at a prescribed interval, to hold a transfer channel 3 (see FIG. 3) consisting of an $n^-$-type impurity region therebetween. The transfer channel 3 is so formed as to extend in a direction X. The photodiode portion 4 and the floating diffusion region 5 are examples of the "photoelectric conversion portion" and the "holding portion" in the present invention respectively.

Figure 4:
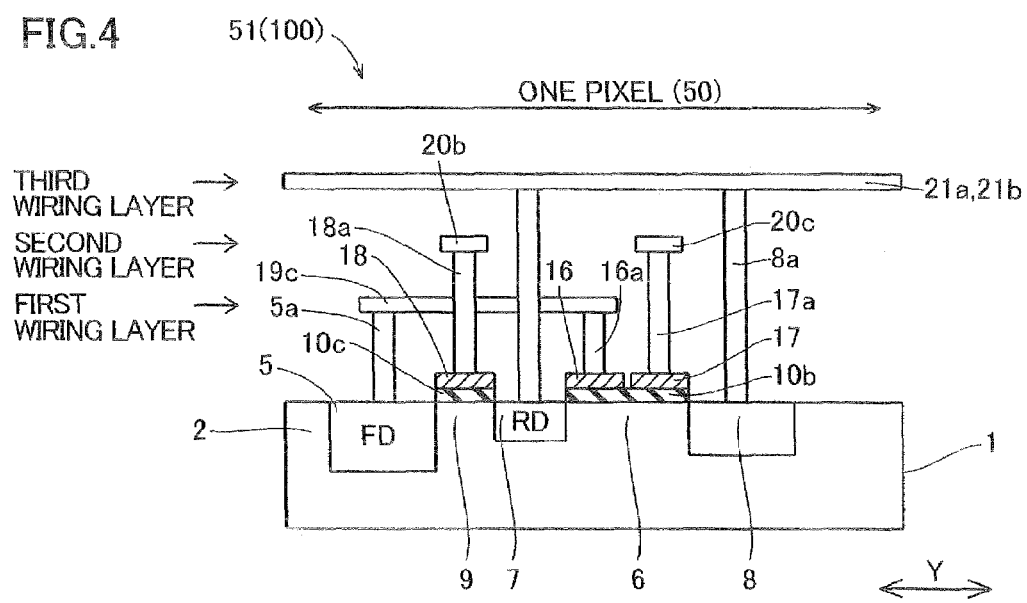
FIG. 4 is a sectional view taken along the line 710-710 in FIG. 2.

On the surface portion of the p-type silicon substrate 1 provided with each pixel 50 and enclosed with the element isolation region 2, further, a reset drain portion (RD) 7 and an output portion 8 are formed at a prescribed interval to hold another transfer channel 6 (see FIG. 4) therebetween, as shown in FIGS. 2 and 4. Still another transfer channel 9 (see FIG. 4) is formed between the floating diffusion region 5 and the reset drain portion 7.

The photodiode portion 4 has a function of generating electrons in response to the quantity of incident light and storing the generated electrons. The photodiode portion 4 is enclosed with the element isolation region 2 and the transfer channel 3 (see FIG. 3), as shown in FIGS. 2 and 3. The floating diffusion region 5 has an impurity concentration ($n^+$) higher than the impurity concentration ($n^-$) of the transfer channel 3. The floating diffusion region 5 is so provided as to hold a charge signal formed by transferred electrons, thereby converting the charge signal to a voltage. The floating diffusion region 5 is enclosed with the element isolation region 2, the transfer channel 3 (see FIG. 3) and the transfer channel 9 (see FIG. 4).

A gate insulating film 10a is formed on the upper surface of the transfer channel 3, as shown in FIG. 3. Transfer gate electrodes 11 to 13, a multiplier gate electrode 14 and a read gate electrode 15 are formed on a prescribed region of the upper surface of the gate insulating film 10a at prescribed intervals, successively from the side of the photodiode portion 4 toward the side of the floating diffusion region 5. In other words, the transfer gate electrode 11 is formed adjacently to the photodiode portion 4. On the other hand, the read gate electrode 15 is formed adjacently to the floating diffusion region 5. The transfer gate electrodes 11, 12 and 13 are examples of the "fifth electrode", the "third electrode" and the "first electrode" in the present invention respectively. The multiplier gate electrode 14 is an example of the "second electrode" in the present invention, and the read gate electrode 15 is an example of the "fourth electrode" in the present invention.

Another gate insulating film 10b is formed on the upper surface of the transfer channel 6, as shown in FIG. 4. An amplifying gate electrode 16 and a row selection gate electrode 17 are formed on a prescribed region of the upper surface of the gate insulating film 10b. The amplifying gate electrode 16 is formed adjacently to the reset drain portion 7, while the row selection gate electrode 17 is formed adjacently to the output portion 8. Still another gate insulating film 10c is formed on the upper surface of the transfer channel 9. A reset gate electrode 18 is formed on the upper surface of the gate insulating film 10c. The reset gate electrode 18 is formed adjacently to the floating diffusion region 5 as well as to the reset drain portion 7.

Figure 5:
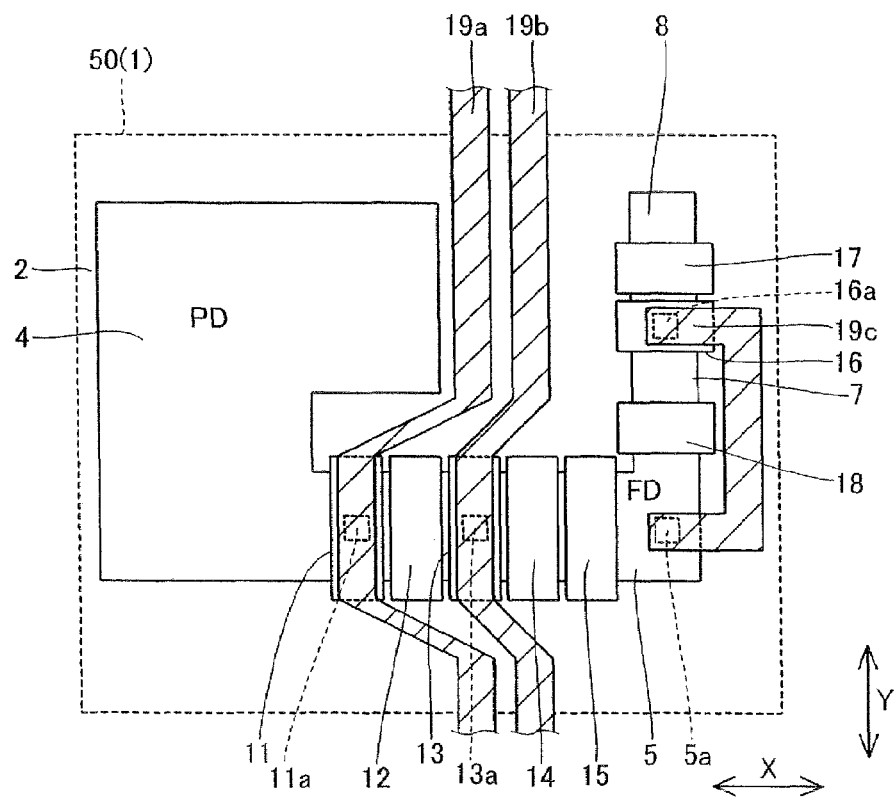
FIG. 5 is a plan view showing a first wiring layer of the CMOS image sensor according to the first embodiment.

According to the first embodiment, a first wiring layer is formed on the upper surface of the p-type silicon substrate 1 through an interlayer dielectric film (not shown). As shown in FIGS. 3 to 5, wires 19a, 19b and 19c consist of the first wiring layer. The wires 19a and 19b are examples of the "fifth wire" and the "first wire" in the present invention respectively. The wire 19a is connected to the transfer gate electrode 11 through a contact portion ha and so formed as to extend in a direction Y while bypassing the region corresponding to the photodiode portion 4, as shown in FIG. 5. The wire 19b is connected to the transfer gate electrode 13 through a contact portion 13a and so formed as to extend in the direction Y while bypassing the region corresponding to the photodiode portion 4. The wire 19c is connected to the floating diffusion region 5 through a contact portion 5a, and also connected to the amplifying gate electrode 16 through another contact portion 16a. The wires 19a and 19b are provided every column. In other words, transfer gate electrodes 11 of a plurality of pixels 50 adjacent to each other in a column direction (direction Y) are connected to each wire 19a, while transfer gate electrodes 13 of the plurality of pixels 50 adjacent to each other in the column direction (direction Y) are connected to each wire 19b. The wire 19c is provided every pixel 50.

Figure 6:
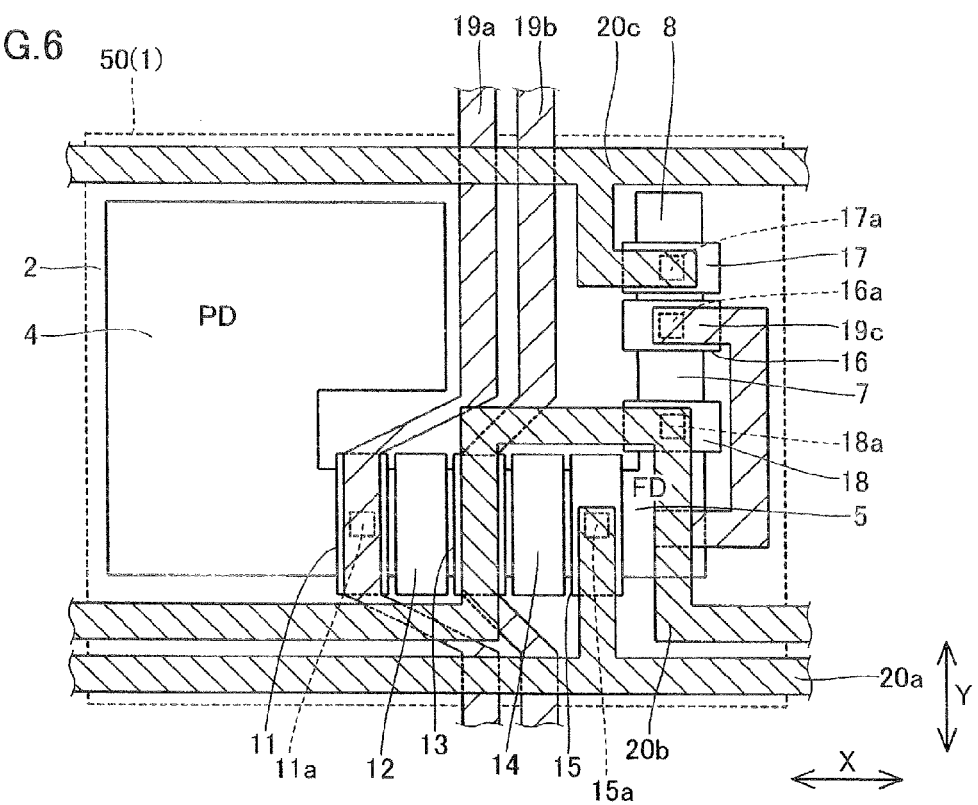
FIG. 6 is a plan view showing the first wiring layer and a second wiring layer of the CMOS image sensor according to the first embodiment shown in FIG. 1.

According to the first embodiment, a second wiring layer is formed on the upper surface of the first wiring layer through another interlayer dielectric film (not shown). As shown in FIGS. 3, 4 and 6, a read gate line 20a, a reset gate line 20b and a row selection line 20c consist of the second wiring layer. The read gate line 20a is an example of the "third wire" in the present invention. The read gate line 20a, the reset gate line 20b and the row selection line 20c are so formed as to extend in a direction X, as shown in FIG. 6. The read gate line 20a is connected to the read gate electrode 15 through a contact portion 15a. The reset gate line 20b is connected to the reset gate electrode 18 through a contact portion 18a, and so formed as to bypass the region corresponding to the contact portion 15a. The row selection line 20c is connected to the row selection gate electrode 17 through a contact portion 17a. The read gate line 20a, the reset gate line 20b and the row selection line 20c are provided every row. In other words, read gate electrodes 15 of a plurality of pixels 50 adjacent to each other in a row direction (direction X) are connected to each read gate line 20a, while reset gate electrodes 18 of the plurality of pixels 50 adjacent to each other in the row direction (direction X) are connected to each reset gate line 20b. Row selection gate electrodes 17 of the plurality of pixels 50 adjacent to each other in the row direction (direction X) are connected to each row selection line 20c.

Figure 7:
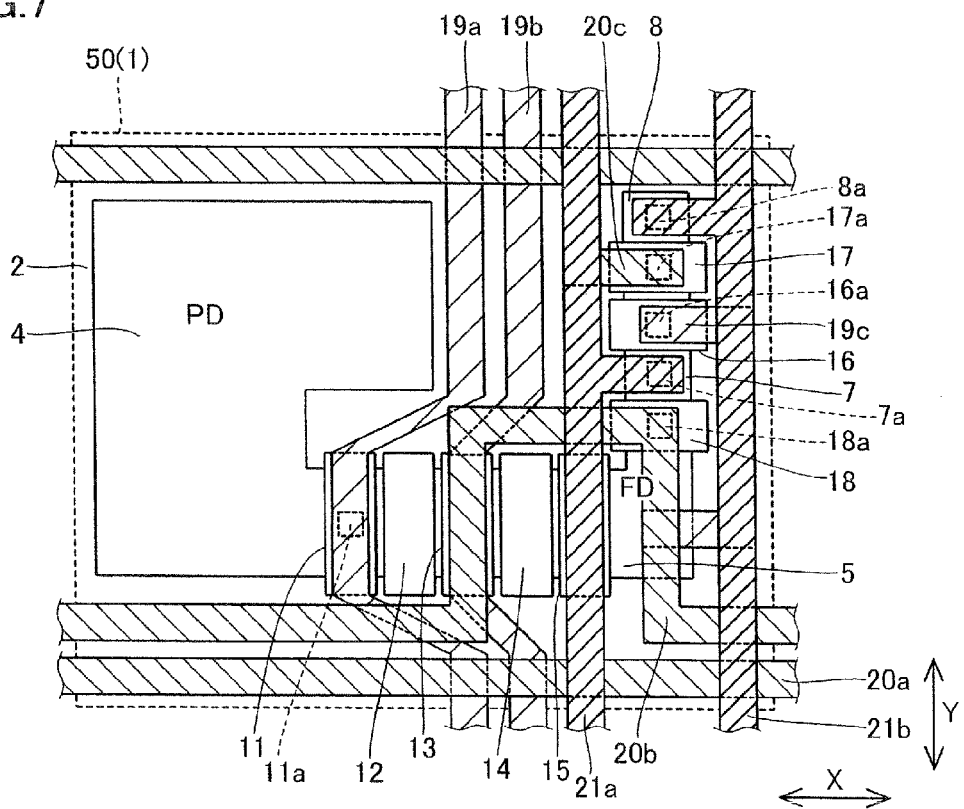
FIG. 7 is a plan view showing the first and second wiring layers and a third wiring layer of the CMOS image sensor according to the first embodiment.

According to the first embodiment, a third wiring layer is formed on the upper surface of the second wiring layer through still another interlayer dielectric film (not shown). As shown in FIGS. 4 and 7, a VDD line 21a and a signal line 21b consist of the third wiring layer. The VDD line 21a and the signal line 21b are so formed as to extend in the direction Y, as shown in FIG. 7. The VDD line 21a is connected to the reset drain portion 7 through a contact portion 7a. The signal line 21b is connected to the output portion 8 through a contact portion 8a. The VDD line 21a and the signal line 21b are provided every column. In other words, reset drain portions 5 of the plurality of pixels 50 adjacent to each other in the column direction (direction Y) are connected to each VDD line 21a, while output portions 8 of the plurality of pixels 50 adjacent to each other in the column direction (direction Y) are connected to each signal line 21b.

According to the first embodiment, a fourth wiring layer is formed on the upper surface of the third wiring layer through a further interlayer dielectric film (not shown). As shown in FIGS. 2 and 3, wires 22a and 22b consist of the fourth wiring layer. The wires 22a and 22b are examples of the "second wire" and the "fourth wire" in the present invention respectively. The wires 22a and 22b are so formed as extend in the direction X, as shown in FIG. 2. The wire 22a is connected to the multiplier gate electrode 14 through a contact portion 14a. The wire 22a consisting of the fourth wiring layer is so formed as to intersect with the wire 19b consisting of the first wiring layer in plan view. The wire 22b consisting of the fourth wiring layer is connected to the transfer gate electrode 12 through a contact portion 12a while bypassing the region corresponding to the photodiode portion 4. The wires 22a and 22b consisting of the fourth wiring layer are provided every row. In other words, multiplier gate electrodes 14 of the plurality of pixels 50 adjacent to each other in the row direction (direction X) are connected to each wire 22a, while transfer gate electrodes 12 of the plurality of pixels 50 adjacent to each other in the row direction (direction X) are connected to each wire 22b.

Figure 8:
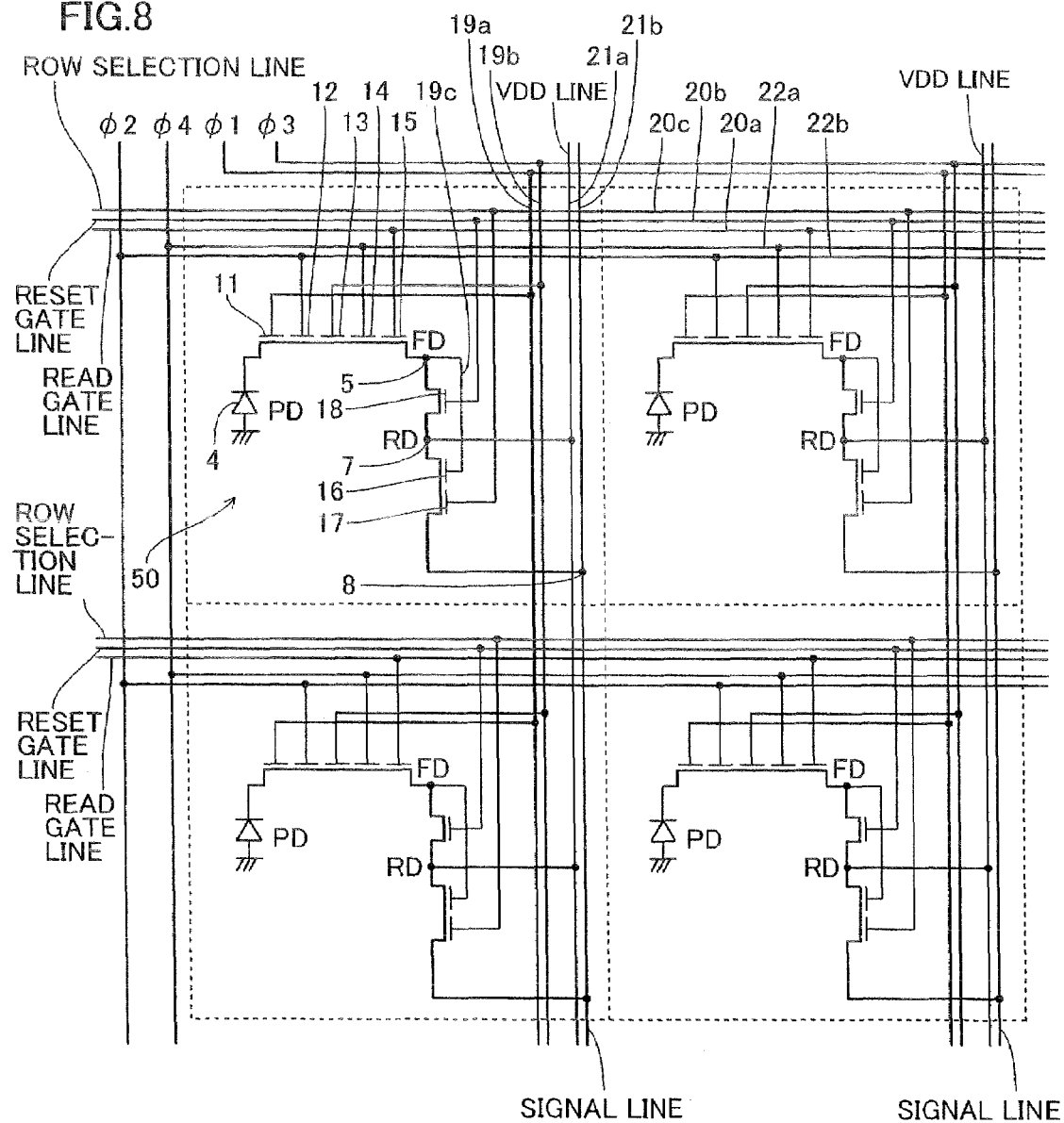
FIG. 8 is a circuit diagram showing the structure of the CMOS image sensor according to the first embodiment.

As shown in FIG. 8, the wires 19a, 22b, 19b and 22a are so provided as to supply clock signals $\phi1$, $\phi2$, $\phi3$ and $\phi4$ for voltage control to the transfer gate electrodes 11, 12 and 13 and the multiplier gate electrode 14 through the contact portions 11a, 12a, 13a and 14a respectively.

When the wires 19a, 22b and 19b supply ON-state (high-level) clock signals $\phi1$, $\phi2$ and $\phi3$ to the transfer gate electrodes 11, 12 and 13 respectively, voltages of about 2.9 V are applied to the transfer gate electrodes 11, 12 and 13, as shown in FIG. 3. When the transfer gate electrodes 11, 12 and 13 are supplied with the ON-state (high-level) clock signals $\phi1$, $\phi2$ and $\phi3$ respectively therefore, the portions of the transfer channel 3 located under the transfer gate electrodes 11, 12 and 13 are regulated to potentials of about 4 V. When the transfer gate electrodes 11, 12 and 13 are supplied with OFF-state (low-level) clock signals $\phi1$, $\phi2$ and $\phi3$ respectively, on the other hand, the portions of the transfer channel 3 located under the transfer gate electrodes 11, 12 and 13 are regulated to potentials of about 1 V.

When the wire 22a consisting of the fourth wiring layer supplies an ON-state (high-level) clock signal $\phi4$ to the multiplier gate electrode 14, a voltage of about 24 V is applied to the multiplier gate electrode 14. When the multiplier gate electrode 14 is supplied with the ON-state (high-level) clock signal $\phi4$, therefore, the portion of the transfer channel 3 located under the multiplier gate electrode 14 is regulated to a high potential of about 25 V. When the multiplier gate electrode 14 is supplied with an OFF-state (low-level) clock signal $\phi4$, on the other hand, the portion of the transfer channel 3 located under the multiplier gate electrode 14 is regulated to a potential of about 1 V.

When the read gate line 20a consisting of the second wiring layer supplies an ON-state (high-level) signal to the read gate electrode 15, a voltage of about 2.9 V is applied to the read gate electrode 15. When the read gate electrode 15 is supplied with the ON-state (high-level) signal, therefore, the portion of the transfer channel 3 located under the read gate electrode 15 is regulated to the potential of about 4 V. When the read gate electrode 15 is supplied with an OFF-state (low-level) signal, on the other hand, the portion of the transfer channel 3 located under the read gate electrode 15 is regulated to a potential of about 1 V. The photodiode portion 4 and the floating diffusion region 5 are regulated to potentials of about 3 V and about 5 V respectively.

When the transfer gate electrode 12 is supplied with an ON-state (high-level) signal, therefore, the portion (an electron storage portion (temporary storage well) 3a) of the transfer channel 3 located under the transfer gate electrode 12 forms an electric field temporarily storing electrons. The electron storage portion 3a is an example of the "storage portion" in the present invention.

When the multiplier gate electrode 14 is supplied with an ON-state (high-level) signal, the portion (an electron multiplier portion (charge accumulation well) 3b) of the transfer channel 3 located under the multiplier gate electrode 14 is regulated to a potential of about 2.5 V, thereby forming a high electric field collisional-ionizing and multiplying (increasing the quantity of) electrons. The electrons are collisional-ionized on the boundary between the portion (electron multiplier portion 3b) of the transfer channel 3 located under the multiplier gate electrode 14 and the portion of the transfer channel 3 located under the transfer gate electrode 9. The electron multiplier portion 3b is an example of the "charge increase portion" in the present invention.

The portion of the transfer channel 3 located under the transfer gate electrode 11 has a function of transferring electrons stored in the photodiode portion 4 to the electron storage portion 3a when the transfer gate electrode 11 is supplied with an ON-state (high-level) signal, and functions as a photodiode separation barrier dividing the photodiode portion 4 and the electron storage portion 3a from each other when the transfer gate electrode 11 is supplied with an OFF-state (low-level) signal.

The portion of the transfer channel 3 located under the transfer gate electrode 13 has a function of transferring electrons stored in the electron storage portion 3a to the electron multiplier portion 3b while transferring electrons stored in the electron multiplier portion 3b to the electron storage portion 3a when the transfer gate electrode 13 is supplied with an ON-state (high-level) signal. Further, the portion of the transfer channel 3 located under the transfer gate electrode 13 functions as a charge transfer barrier dividing the electron storage portion 3a and the electron multiplier portion 3b from each other when the transfer gate electrode 13 is supplied with an OFF-state (low-level) signal. In other words, the transfer gate electrode 13 is enabled to transfer the electrons stored in the electron storage portion 3a to the electron multiplier portion 3b while transferring the electrons stored in the electron multiplier portion 3b to the electron storage portion 3a when supplied with the ON-state (high-level) signal.

The portion of the transfer channel 3 located under the read gate electrode 15 has a function of transferring electrons stored in the electron multiplier portion 3b to the floating diffusion region 5 when the read gate electrode 15 is supplied with an ON-state (high-level) signal while dividing the electron multiplier portion 3b and the floating diffusion region 5 from each other when an OFF-state (low-level) signal is supplied to the read gate electrode 15. In other words, the read gate electrode 15 is enabled to transfer the electrons stored in the electron multiplier portion 3b to the floating diffusion region 5 when supplied with the ON-state (high-level) signal.

As shown in FIG. 8, the reset gate line 20b consisting of the second wiring layer is supplied with a reset signal, while the row selection line 20c is connected to the row selection register 52 (see FIG. 1). The signal line 21b consisting of the third wiring layer is connected to the column selection register 53 (see FIG. 1), while the VDD line 21a is supplied with a power supply voltage VDD (about 5 V, for example).

An electron multiplying operation of the CMOS image sensor 100 according to the first embodiment is described with reference to FIGS. 9 and 10.

Figure 9:
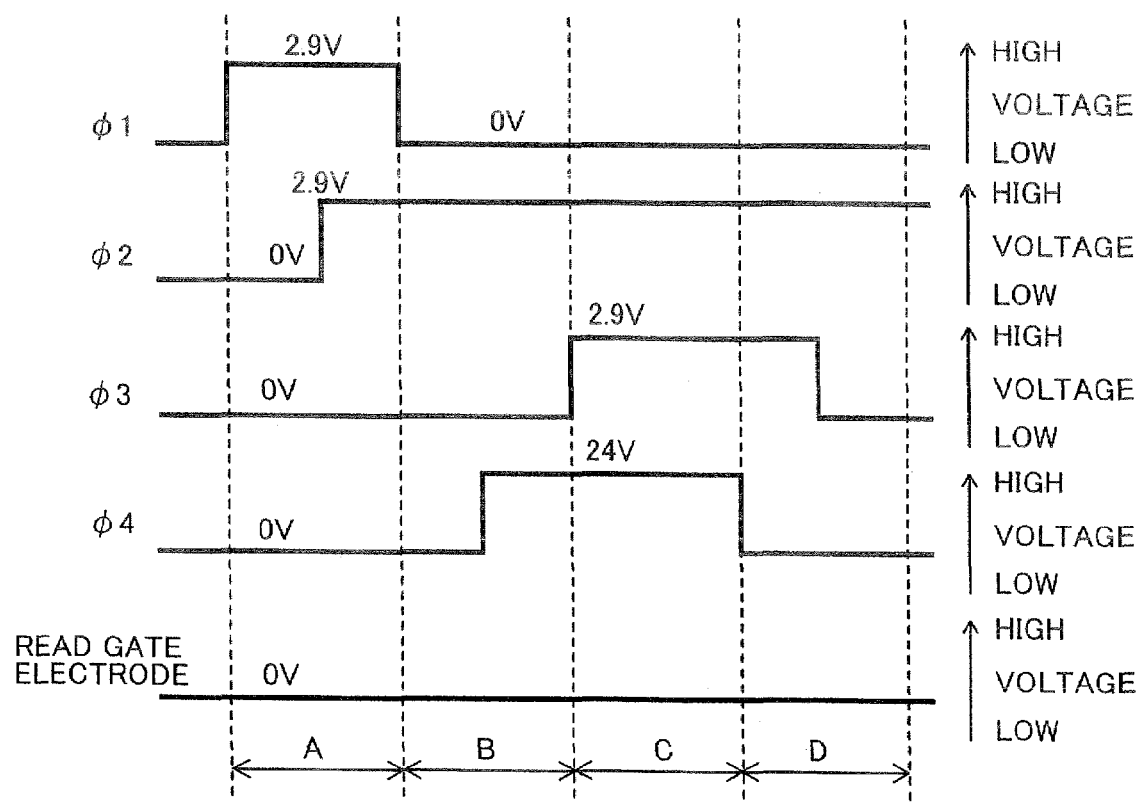
FIG. 9 is a signal waveform diagram for illustrating an electron multiplying operation of the CMOS image sensor according to the first embodiment.
Figure 10:
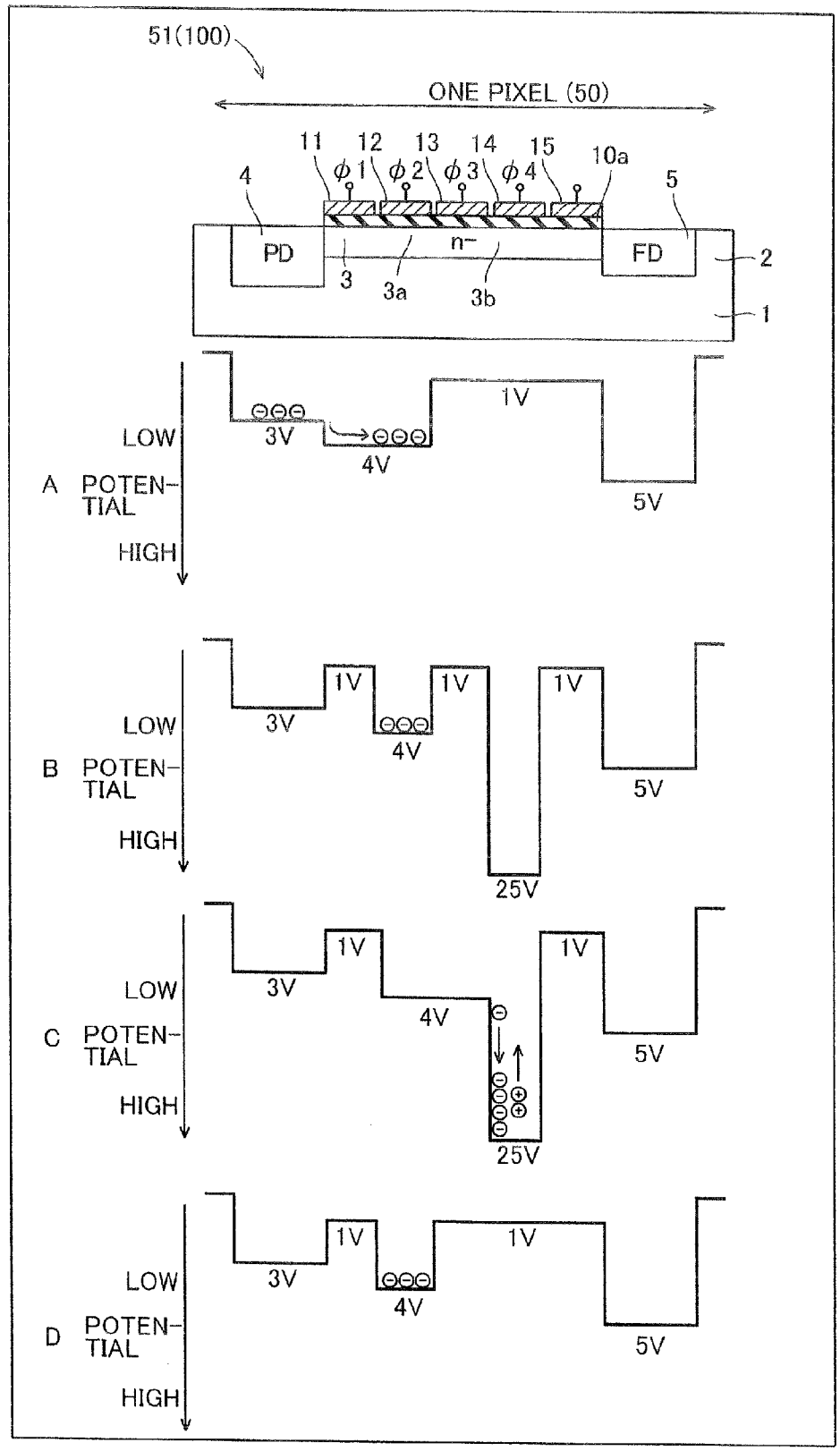
FIG. 10 is a potential diagram for illustrating the electron multiplying operation of the CMOS image sensor according to the first embodiment.

In a period A shown in FIG. 9, the transfer gate electrode 11 is turned on thereby regulating the portion of the transfer channel 3 located under the transfer gate electrode 11 to the potential of about 4 V, as shown in FIG. 10. At this time, electrons generated by and stored in the photodiode portion 4 regulated to the potential of about 3 V are transferred from the photodiode portion 4 to the portion of the transfer channel 3 located under the transfer gate electrode 11. Thereafter the transfer gate electrode 12 is turned on, thereby regulating the portion of the transfer channel 3 located under the transfer gate electrode 12 to the potential of about 4 V.

Then, in a period B shown in FIG. 9, the transfer gate electrode 11 is turned off thereby regulating the portion of the transfer channel 3 located under the transfer gate electrode 11 to the potential of about 1 V as shown in FIG. 10. At this time, electrons present in the portion of the transfer channel 3 located under the transfer gate electrode 11 are transferred to the portion (electron accumulating portion 3a), regulated to the potential of about 4 V, of the transfer channel 3 located under the transfer gate 12. Thereafter the multiplier gate electrode 14 is turned on, thereby regulating the portion (electron multiplier portion 3b) of the transfer channel 3 located under the multiplier gate electrode 14 to the potential of about 25 V.

Then, in a period C shown in FIG. 9, the transfer gate electrode 13 is turned on thereby regulating the portion of the transfer channel 3 located under the transfer gate electrode 13 to the potential of about 4 V, as shown in FIG. 10. At this time, electrons stored in the portion (electron storage portion 3a) of the transfer channel 3 located under the transfer gate electrode 12 are transferred to the portion (electron multiplier portion 3b), regulated to the potential (about 25 V) higher than the potentials (about 4 V) of the portions of the transfer channel 3 located under the transfer gate electrodes 12 and 13, of the transfer channel 3 located under the multiplier gate electrode 14. The electrons transferred to the portion (electron multiplier portion 3b) of the transfer channel 3 located under the multiplier gate electrode 14 are supplied with energy from the high electric field during transition through the boundary between the portions of the transfer channel 3 located under the multiplier gate electrode 14 and the transfer gate electrode 13. The electrons having high energy collide with silicon atoms, to form electrons and holes. Thereafter the electrons formed by collisional ionization are stored in the portion (electron multiplier portion 3b) of the transfer channel 3 located under the multiplier gate electrode 14 by the electric field.

Then, in a period D shown in FIG. 9, the multiplier gate electrode 14 is turned off thereby regulating the portion of the transfer channel 3 located under the multiplier gate electrode 14 to the potential of about 1 V, as shown in FIG. 10. At this time, electrons stored in the portion of the transfer channel 3 located under the multiplier gate electrode 14 are transferred to the portions, regulated to the potentials (about 4 V) higher than the potential (about 1 V) of the portion of the transfer channel 3 located under the multiplier gate electrode 14, of the transfer channel 3 located under the transfer gate electrodes 12 and 13. Thereafter the transfer gate electrode 13 is turned off, thereby regulating the portion of the transfer channel 3 located under the transfer gate electrode 13 to the potential of about 1 V. At this time, electrons present in the portion of the transfer channel 3 located under the transfer gate electrode 13 are transferred to the portion (electron storage portion 3a), regulated to the potential (about 4 V) higher than the potential (about 1 V) of the portion of the transfer channel 3 located under the transfer gate electrode 13, of the transfer channel 3 located under the transfer gate electrode 12.

Thereafter the aforementioned multiplying operation in the periods B to D is repeated a plurality of times (about 400 times, for example), thereby multiplying electrons transferred from the photodiode portion 4 to about 2000 times.

An electron read operation of the CMOS image sensor 100 according to the first embodiment is described with reference to FIGS. 8 and 10 to 12.

Figure 11:
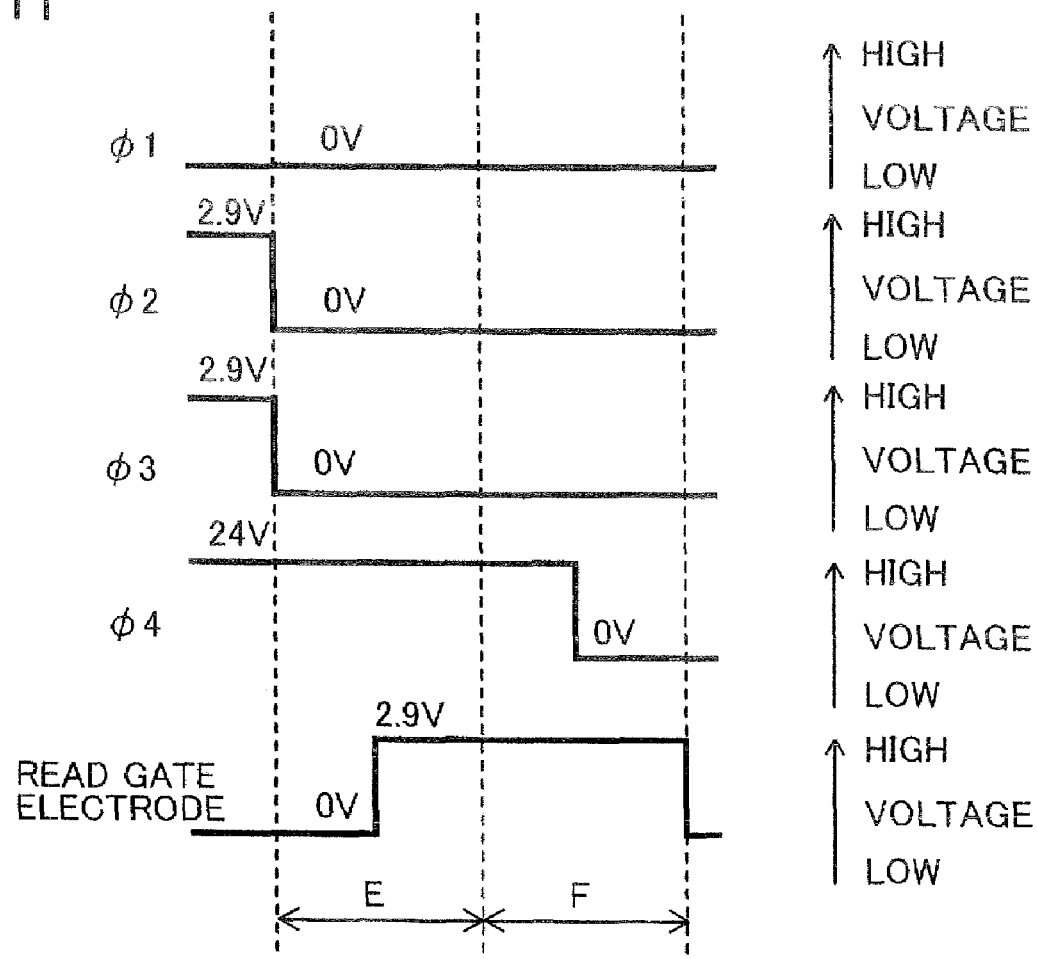
FIG. 11 is a signal waveform diagram for illustrating an electron read operation of the CMOS image sensor according to the first embodiment.
Figure 12:
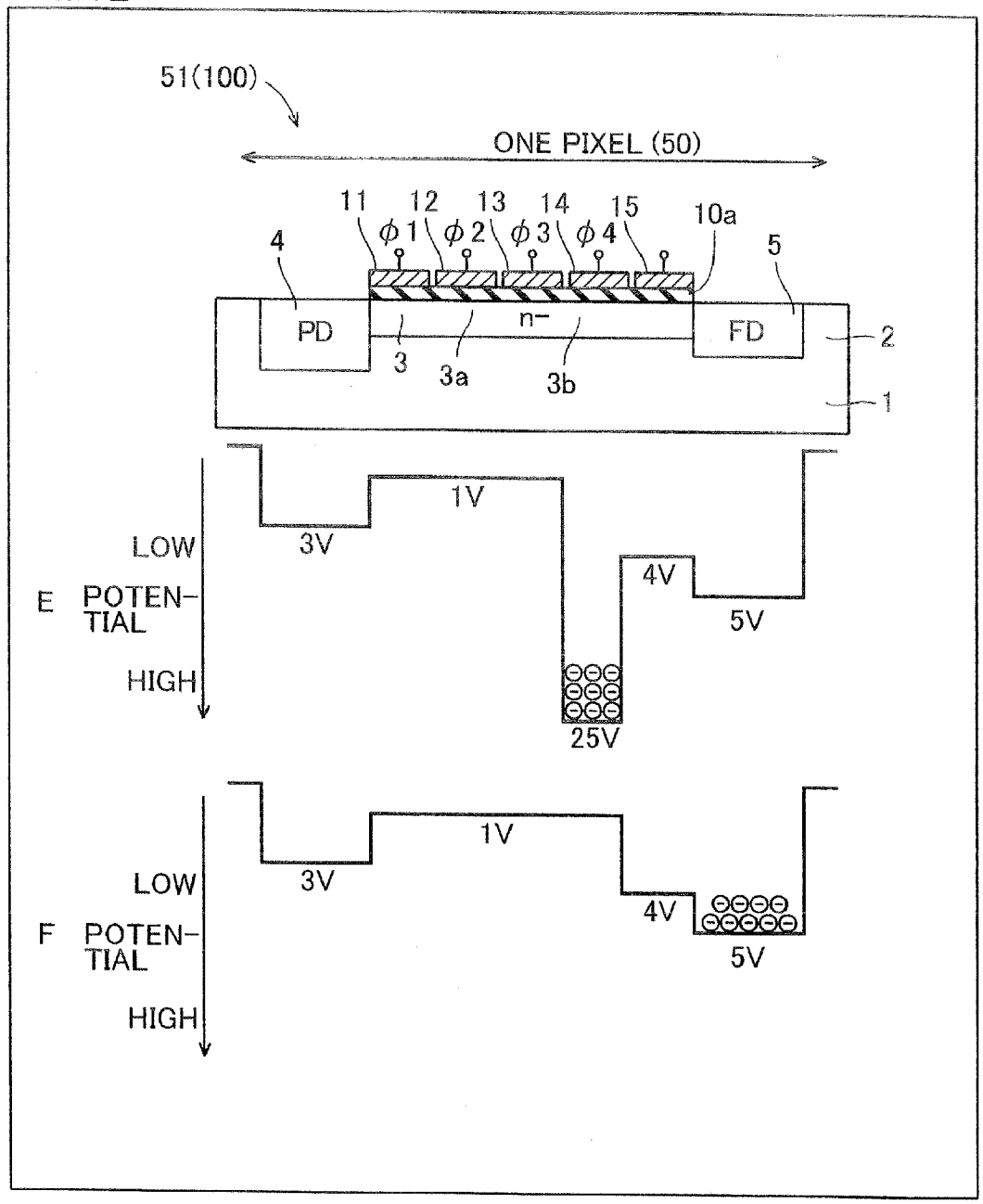
FIG. 12 is a potential diagram for illustrating the electron read operation of the CMOS image sensor according to the first embodiment.

In a period E shown in FIG. 11 for the electron read operation subsequent to the operation in the period C shown in FIG. 10, the transfer gate electrodes 12 and 13 are turned off while the portion (electron multiplier portion 3b) of the transfer channel 3 located under the multiplier gate electrode 14 stores electrons thereby regulating the portions of the transfer channel 3 located under the transfer gate electrodes 12 and 13 to the potentials of about 1 V, as shown in FIG. 12. Thereafter the read gate electrode 15 is turned on, thereby regulating the portion of the transfer channel 3 located under the read gate electrode 15 to the potential of about 4 V.

In a period F shown in FIG. 11, the multiplier gate electrode 14 is turned off thereby regulating the portion of the transfer channel 3 located under the multiplier gate electrode 14 to the potential of about 1 V, as shown in FIG. 12. At this time, electrons stored in the portion (electron multiplier portion 3b) of the transfer channel 3 located under the multiplier gate electrode 14 are transferred to the floating diffusion region 5 regulated to the potential (about 5 V) higher than the potential (about 1 V) of the portion of the transfer channel 3 located under the multiplier gate electrode 14 through the portion, regulated to the potential of about 4 V, of the transfer channel 3 located under the read gate electrode 15.

At this time, the amplifier gate electrode 16, connected to the floating diffusion region 5 through the wire 19c, of each pixel 50 enters an ON state responsive to the electrons held in the floating diffusion region 5, as shown in FIG. 8. In this state, no current flows to the signal line 21b due to the OFF-state of the row selection gate electrode 17.

Then, a high-level signal is successively supplied to the row selection line 20c, thereby successively turning on the row selection gate electrode 17. Thus, a current successively flows to the signal line 21b due to the ON-state of the multiplier gate electrode 16. Therefore, a charge signal formed by electrons supplied to the floating diffusion region 5 is output as a voltage signal. After all voltage signals are output, a high-level reset signal is supplied to the reset gate line 20b for turning on the reset gate electrode 18, thereby resetting the potentials of the floating diffusion regions 5 of all pixels 50 to about 5 V.

According to the first embodiment, as hereinabove described, the wire 19b for supplying the clock signal φ3 to the transfer gate electrode 13 is formed by the first wiring layer while the wire 22a for supplying the clock signal φ4 to the multiplier gate electrode 14 is formed by the fourth wiring layer different from the first wiring layer so that the distance between the wire 19b consisting of the first wiring layer and the wire 22a consisting of the fourth wiring layer is increased as compared with a case where the wires 19b and 22a are adjacently formed by the same layer, whereby the capacitance between the wire 19b consisting of the first wiring layer and the wire 22a consisting of the fourth wiring layer can be reduced. Thus, the voltages of the clock signals φ3 and φ4 supplied to the transfer gate electrode 13 and the multiplier gate electrode 14 of each pixel 50 respectively can be inhibited from dispersion. Consequently, the potential difference between the portions of the transfer channel 3 located under the transfer gate electrode 13 and the multiplier gate electrode 14 respectively can be inhibited from dispersion in each pixel 50, whereby each pixel 50 can be inhibited from dispersion in electron multiplication factor.

According to the first embodiment, the wire 19b consisting of the first wiring layer is so formed as to intersect with the wire 22a consisting of the fourth wiring layer so that the areas of opposed portions of the wire 19b consisting of the first wiring layer and the wire 22a consisting of the fourth wiring layer can be reduced, whereby the capacitance between the wire 19b consisting of the first wiring layer and the wire 22a consisting of the fourth wiring layer can be further reduced. Thus, the voltages of the clock signals φ3 and φ4 supplied to the transfer gate electrode 13 and the multiplier gate electrode 14 of each pixel 50 respectively can be further inhibited from dispersion.

According to the first embodiment, the wire 22a is formed by the fourth wiring layer different from the first wiring layer so that the wire 19b consisting of the first wiring layer can be so arranged as to bypass the region corresponding to the photodiode portion 4 dissimilarly to the case where the wires 19b and 22a are adjacently formed by the same layer, whereby the numerical aperture of the CMOS image sensor 100 can be improved.

According to the first embodiment, the electron storage portion 3a for storing and transferring electrons is so formed that the electron multiplication factor can be improved by alternately repeating electron multiplication through electron transfer from the electron storage portion 3a to the electron multiplier portion 3b and electron transfer from the electron multiplier portion 3b to the electron storage portion 3a.

According to the first embodiment, the wire 22a for supplying the clock signal φ4 to the multiplier gate electrode 14 is formed by the fourth wiring layer while the read gate line 20a for supplying the signal to the read gate electrode 15 is formed by the second wiring layer different from the fourth wiring layer so that the distance between the wire 22a and the read gate line 20a is increased as compared with a case where the wire 22a and the read gate line 20a are adjacently formed by the same layer, whereby the capacitance between the wire 22a and the read gate line 20a can be reduced. Thus, the signal supplied to the read gate electrode 15 through the read gate line 20a can be inhibited from fluctuation resulting from conversion of an ON-state signal, supplied to the multiplier gate electrode 14 for forming the electric field for collisional-ionizing electrons through the wire 22a in data reading, to an OFF-state signal. Consequently, data can be correctly read.

According to the first embodiment, the wire 22b supplying the clock signal φ2 to the transfer gate electrode 12 is formed by the fourth wiring layer while the wire 19b supplying the clock signal φ3 to the transfer gate electrode 13 is formed by the first wiring layer different from the fourth wiring layer while the wires 22b and 19b are so formed as to intersect with each other, whereby the capacitance between the wires 22b and 19b can be reduced as compared with a case where the wires 22b and 19b are adjacently formed by the same layer. Thus, the transfer gate electrode 12 can stably form the electric field for temporarily storing electrons in the electron storage portion 3a.

According to the first embodiment, the signal line 21b is formed by the third wiring layer different from the second wiring layer provided with the read gate line 20a to intersect with the read gate line 20a, whereby the capacitance between the signal line 21b and the read gate line 20a can be reduced as compared with a case where the signal line 21b and the read gate line 20a are by the same layer. Therefore, the read gate line 20a can reliably output the electrons held in the floating diffusion region 5.

According to the first embodiment, the wire 19a is formed along the outer edge of the photodiode portion 4 without overlapping a region corresponding to the photodiode portion 4 in plan view. When the plane area of the photodiode portion 4 is increased, therefore, light can be converted to electrons in response to the increased plane area of the photodiode portion 4 even when the illuminance is at a low level, due to the wire 19a so arranged as not to overlap the photodiode portion 4.

According to the first embodiment, the wire 22b is so formed as to overlap the wire 19a in plan view on the region where the wire 19a is formed along the outer edge of the photodiode portion 4, whereby the plane area of the photodiode portion 4 in each pixel 50 can be increased due to the wires 22b and 19a overlapping each other.

According to the first embodiment, the wire 19b is separated from the wire 22a through the second and third wiring layers, whereby the capacitance between the wires 19b and 22a can be further reduced due to the plurality of layers interposed therebetween.

Second Embodiment

Referring to FIGS. 13 to 16, two pixels 150a and 150b adjacent to each other in a direction X share a floating diffusion region 105 in a CMOS image sensor 200 according to a second embodiment of the present invention, dissimilarly to the aforementioned first embodiment.

Figure 13:
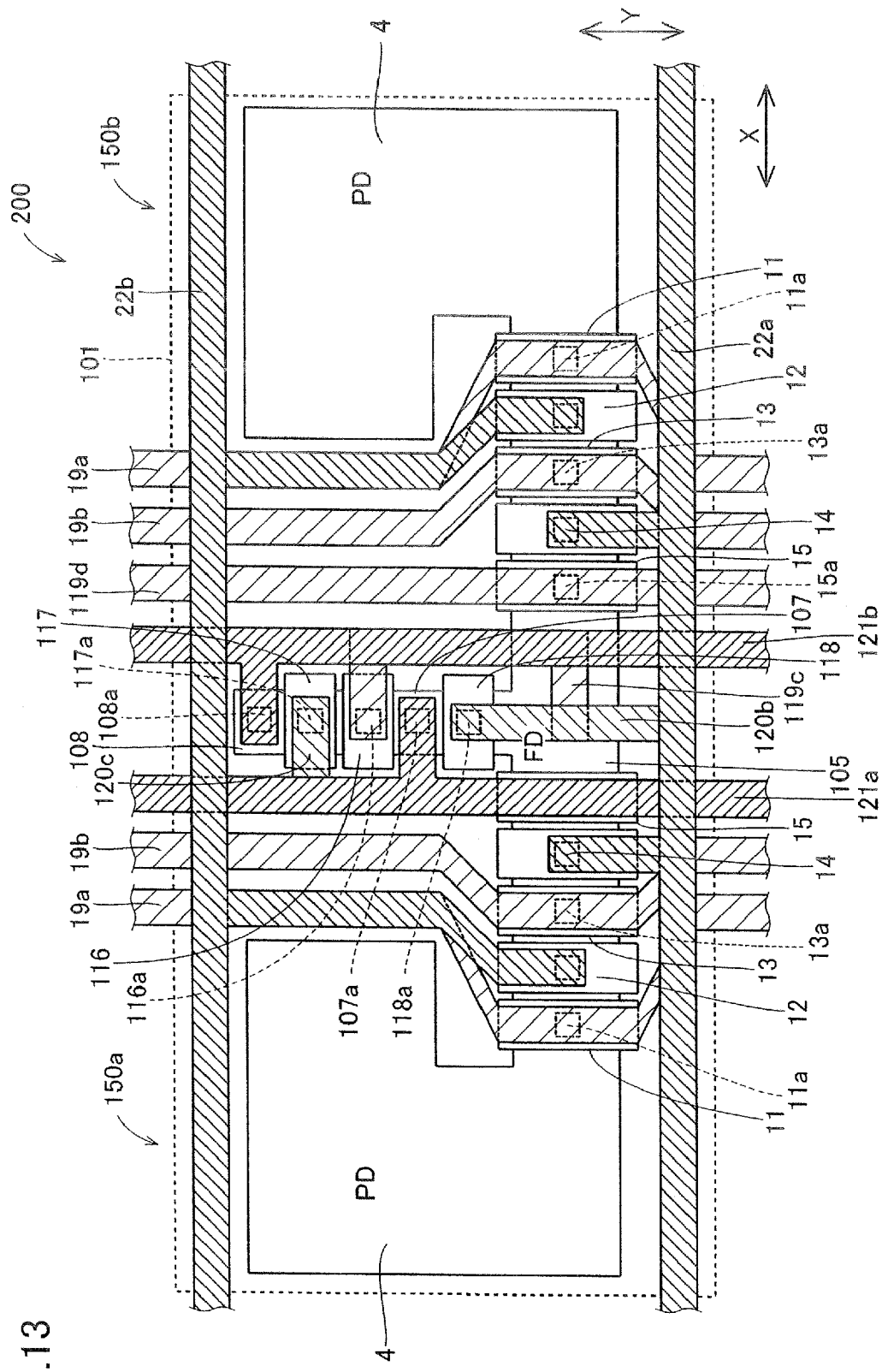
FIG. 13 is a plan view showing the structure of a CMOS image sensor according to a second embodiment of the present invention.

According to the second embodiment, the floating diffusion region 105 is provided adjacently to read gate electrodes 15 of the pixels 150a and 150b and a reset gate electrode 118, as shown in FIG. 13. The floating diffusion region 105 is an example of the "holding portion" in the present invention.

According to the second embodiment, the reset gate electrode 118, a reset drain portion 107, an amplifying gate electrode 116, a row selection gate electrode 117 and an output portion 108 shared by the pixels 150a and 150b are provided on the boundary between the pixels 150a and 150b.

The remaining structures of the floating diffusion region 105, the reset gate electrode 118, the reset drain portion 107, the amplifying gate electrode 116, the row selection gate electrode 117 and the output portion 108 are similar to those of the floating diffusion region 5, the reset gate electrode 18, the reset drain portion 7, the amplifying gate electrode 16, the row selection gate electrode 17 and the output portion 8 of the CMOS image sensor 100 according to the aforementioned first embodiment respectively.

Figure 14:
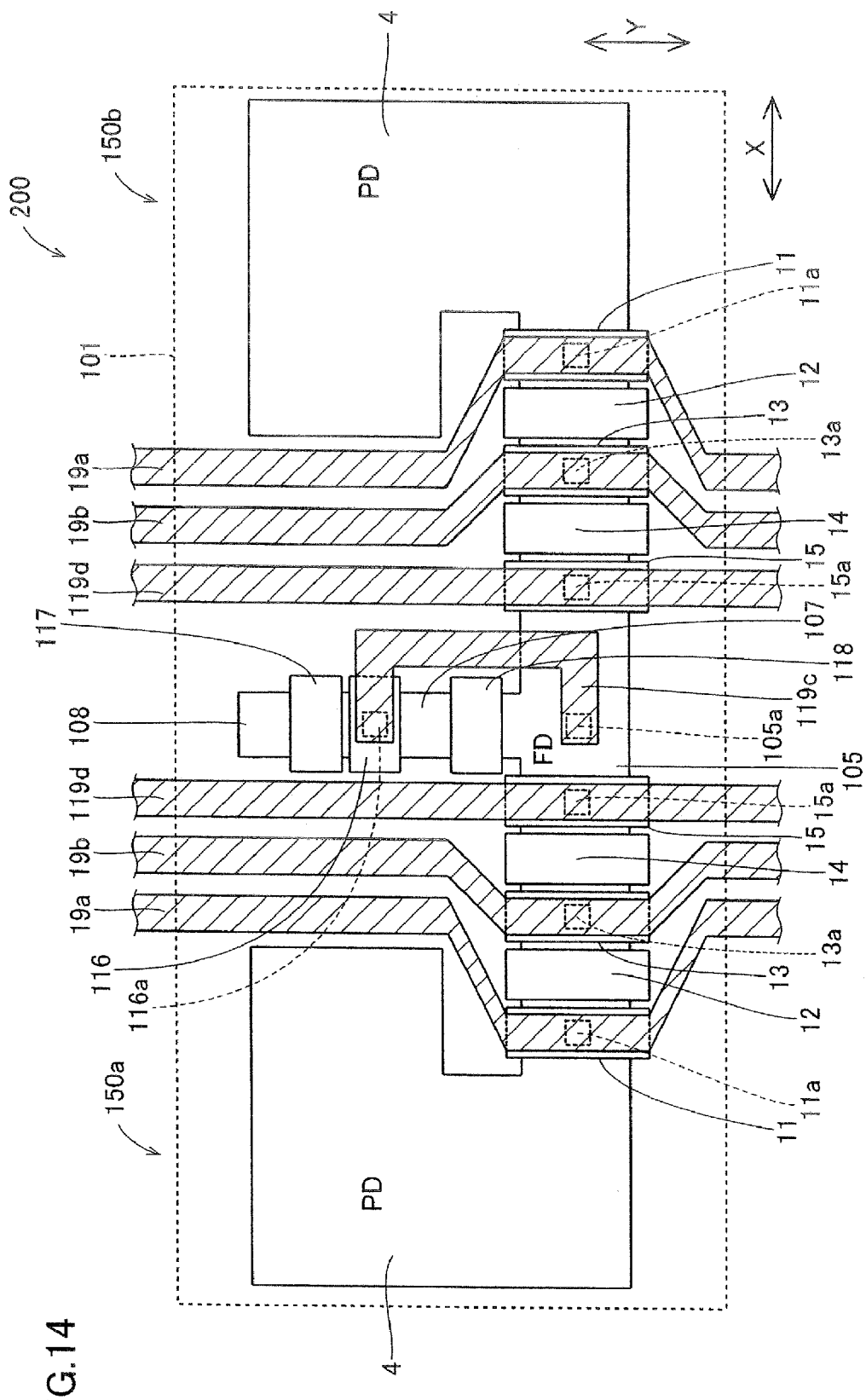
FIG. 14 is a plan view showing a first wiring layer of the CMOS image sensor according to the second embodiment.

According to the second embodiment, a first wiring layer is formed on the upper surface of a p-type silicon substrate 101 through an interlayer dielectric film (not shown). As shown in FIG. 14, wires 19a, 19b and 119c and a read gate line 119d consist of the first wiring layer. The read gate line 119d is an example of the "third wire" in the present invention. The wire 119c is shared by the pixels 150a and 150b. The wire 119c is connected to the amplifying gate electrode 116 through a contact portion 116a, and connected to the floating diffusion region 105 through another contact portion 105a. The read gate line 119d is so formed as to extend in a direction Y every column. The read gate line 119d is connected with read gate electrodes 15 of a plurality of pixels 150a (150b) adjacent to each other in a column direction (direction Y). The remaining structures of the wire 119c and the read gate line 119d are similar to those of the wire 19c and the read gate line 20a of the CMOS image sensor 100 according to the aforementioned first embodiment.

Figure 15:
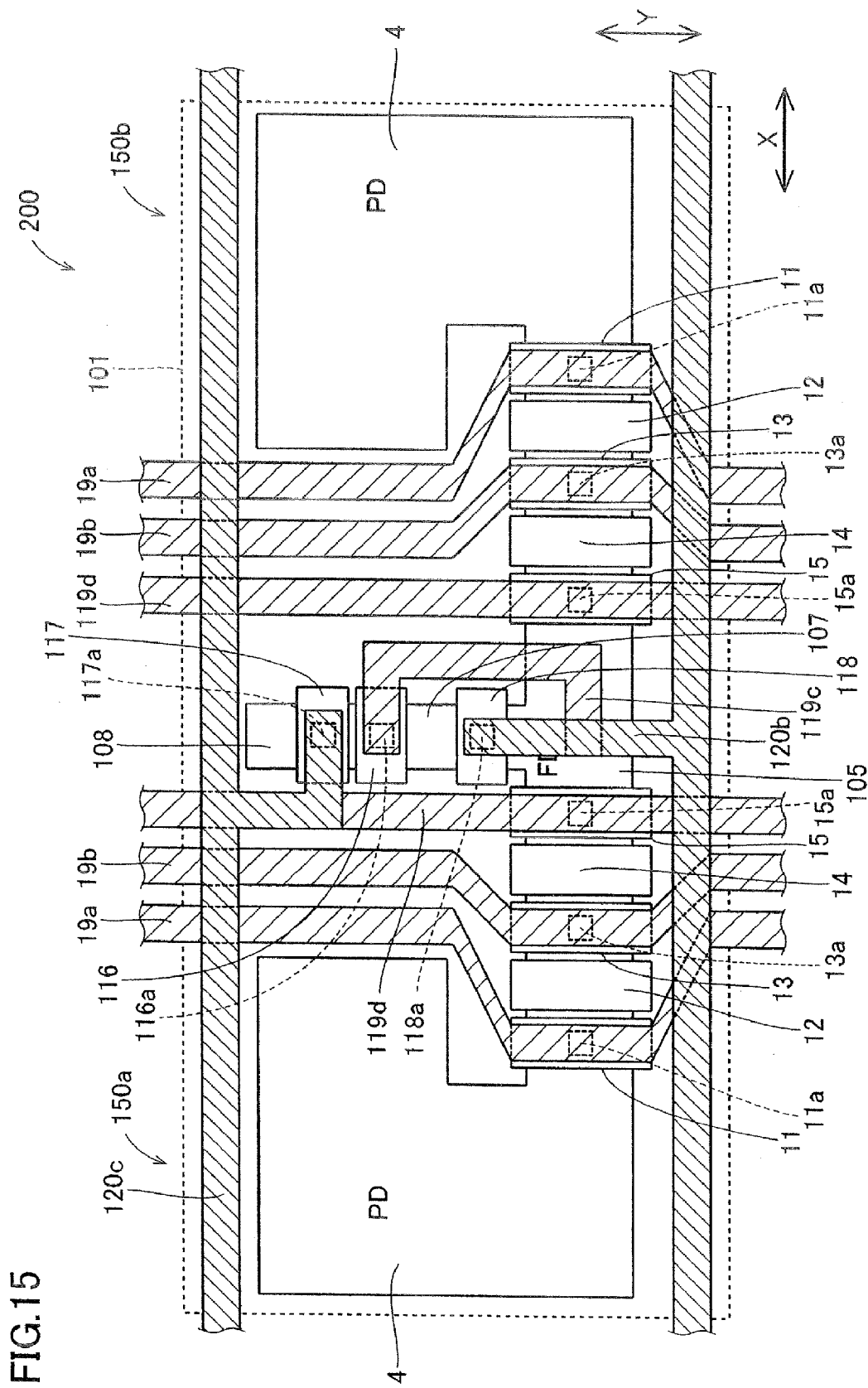
FIG. 15 is a plan view showing the first wiring layer and a second wiring layer of the CMOS image sensor according to the second embodiment.

According to the second embodiment, a second wiring layer is formed on the upper surface of the first wiring layer through another interlayer dielectric film (not shown). As shown in FIG. 15, a reset gate line 120b and a row selection line 120c consist of the second wiring layer. The reset gate line 120b is connected to the reset gate electrode 118 through a contact portion 118a. The row selection line 120c is connected to the row selection gate electrode 117 through a contact portion 117a. The remaining structures of the reset gate line 120b and the row selection line 120c are similar to those of the reset gate line 20b and the row selection line 20c of the CMOS image sensor 100 according to the aforementioned first embodiment respectively.

Figure 16:
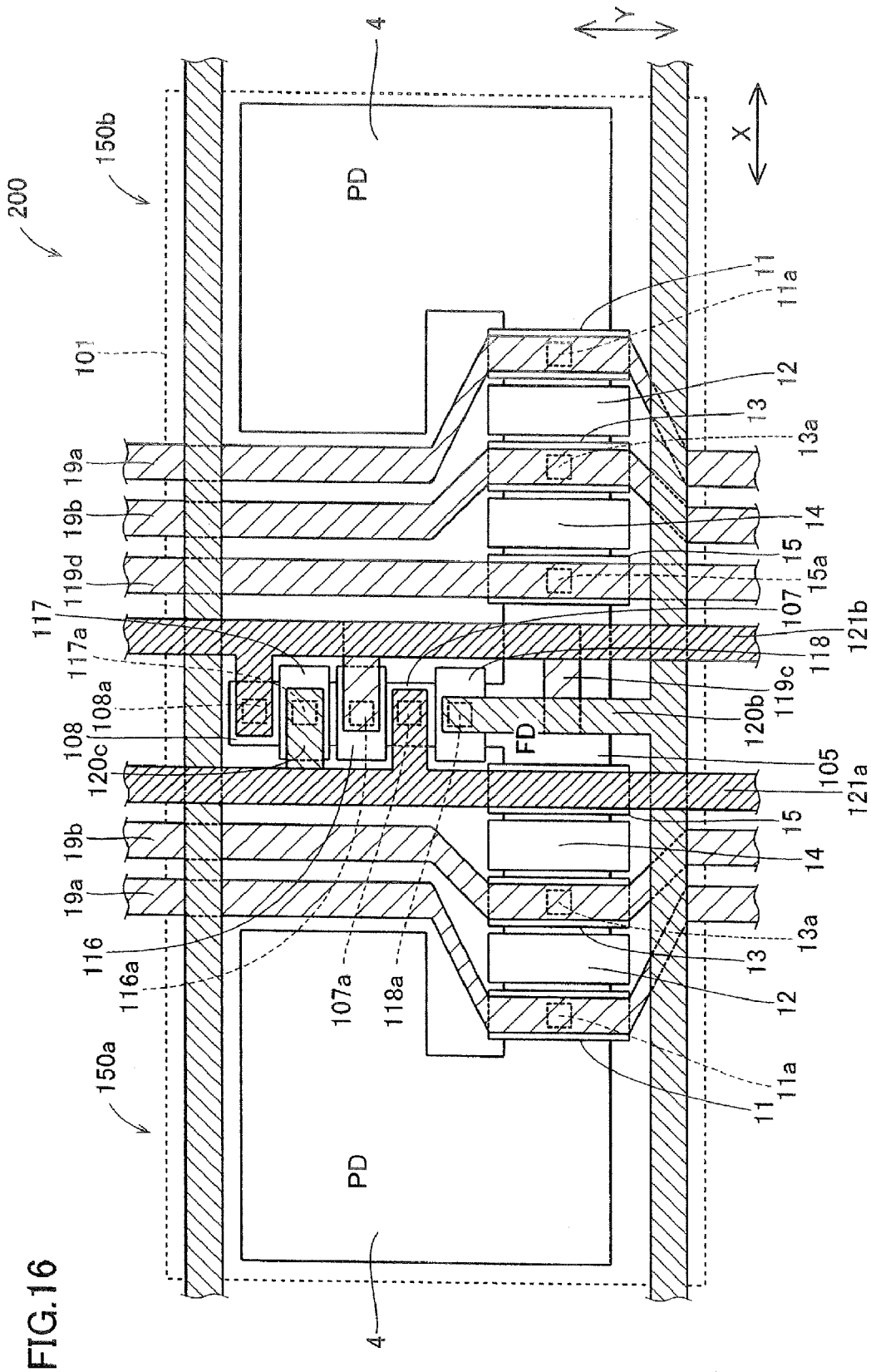
FIG. 16 is a plan view showing the first and second wiring layers and a third wiring layer of the CMOS image sensor according to the second embodiment.

According to the second embodiment, a third wiring layer is formed on the upper surface of the second wiring layer through still another interlayer dielectric film (not shown). As shown in FIG. 16, a VDD line 121a and a signal line 121b consist of the third wiring layer. The VDD line 121 is connected to the reset drain portion 107 through a contact portion 107a. The signal line 121b is connected to the output portion 108 through a contact portion 108a. The remaining structures of the VDD line 121a and the signal line 121b are similar to those of the VDD line 21a and the signal line 21b of the CMOS image sensor 100 according to the aforementioned first embodiment respectively.

According to the second embodiment a fourth wiring layer is formed on the upper surface of the third wiring layer through still another interlayer dielectric film (not shown). As shown in FIG. 13, wires 22a and 22b consist of the fourth wiring layer.

The remaining structure of the second embodiment is similar to that of the aforementioned first embodiment.

According to the second embodiment, as hereinabove described, the two pixels 150a and 150b adjacent to each other in the direction X so share the floating diffusion region 105 that a photoreceiving area of a photodiode portion 4 in the CMOS image sensor 200 can be increased as compared with a case of providing the floating diffusion region 105 every pixel. Thus, the photosensitivity of the CMOS image sensor 200 can be improved.

According to the second embodiment, the read gate line 119d consisting of the first wiring layer is so formed as to intersect with the wire 22a consisting of the fourth wiring layer so that the areas of the portions of the read gate line 119d consisting of the first wiring layer and the wire 22a consisting of the fourth wiring layer opposed to each other can be reduced, whereby the capacitance between the read gate line 119d consisting of the first wiring layer and the wire 22a consisting of the fourth wiring layer can be further reduced. Thus, signals supplied to the read gate electrode 15 through the read gate line 119d can be inhibited from fluctuation resulting from conversion of ON-state signals, supplied to multiplier gate electrodes 14 for forming electric fields for collisional-ionizing electrons through the wire 22a in data reading, to OFF-state signals.

The remaining effects of the second embodiment are similar to those of the aforementioned first embodiment.

Third Embodiment

Referring to FIGS. 17 to 20, two pixels 250a and 250b adjacent to each other in a direction X share a multiplier gate electrode 214 and a read gate electrode 215 in addition to a floating diffusion region 105 in a CMOS image sensor 300 according to a third embodiment of the present invention, dissimilarly to the aforementioned second embodiment.

Figure 17:
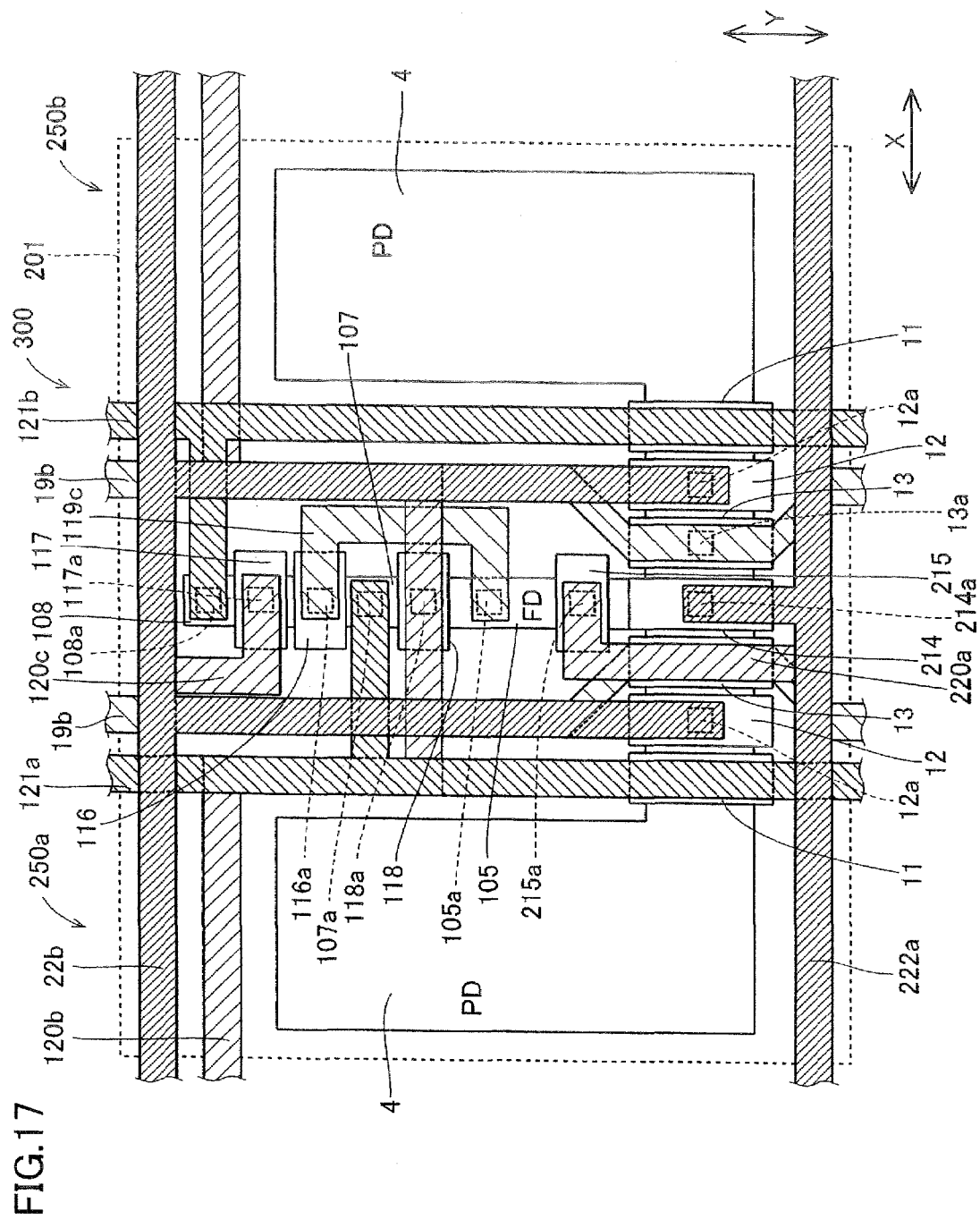
FIG. 17 is a plan view showing the structure of a CMOS image sensor according to a third embodiment of the present invention.

According to the third embodiment, the multiplier gate electrode 214 is provided adjacently to transfer gate electrodes 13 of the pixels 250a and 250b and the read gate electrode 215, as shown in FIG. 17. The read gate electrode 215 is provided adjacently to the floating diffusion region 105. The remaining structures of the multiplier gate electrode 214 and the read gate electrode 215 are similar to those of the multiplier gate electrode 14 and the read gate electrode 15 of the CMOS image sensor 100 according to the aforementioned first embodiment respectively. The multiplier gate electrode 214 and the read gate electrode 215 are examples of the "second electrode" and the "fourth electrode" in the present invention respectively.

Figure 18:
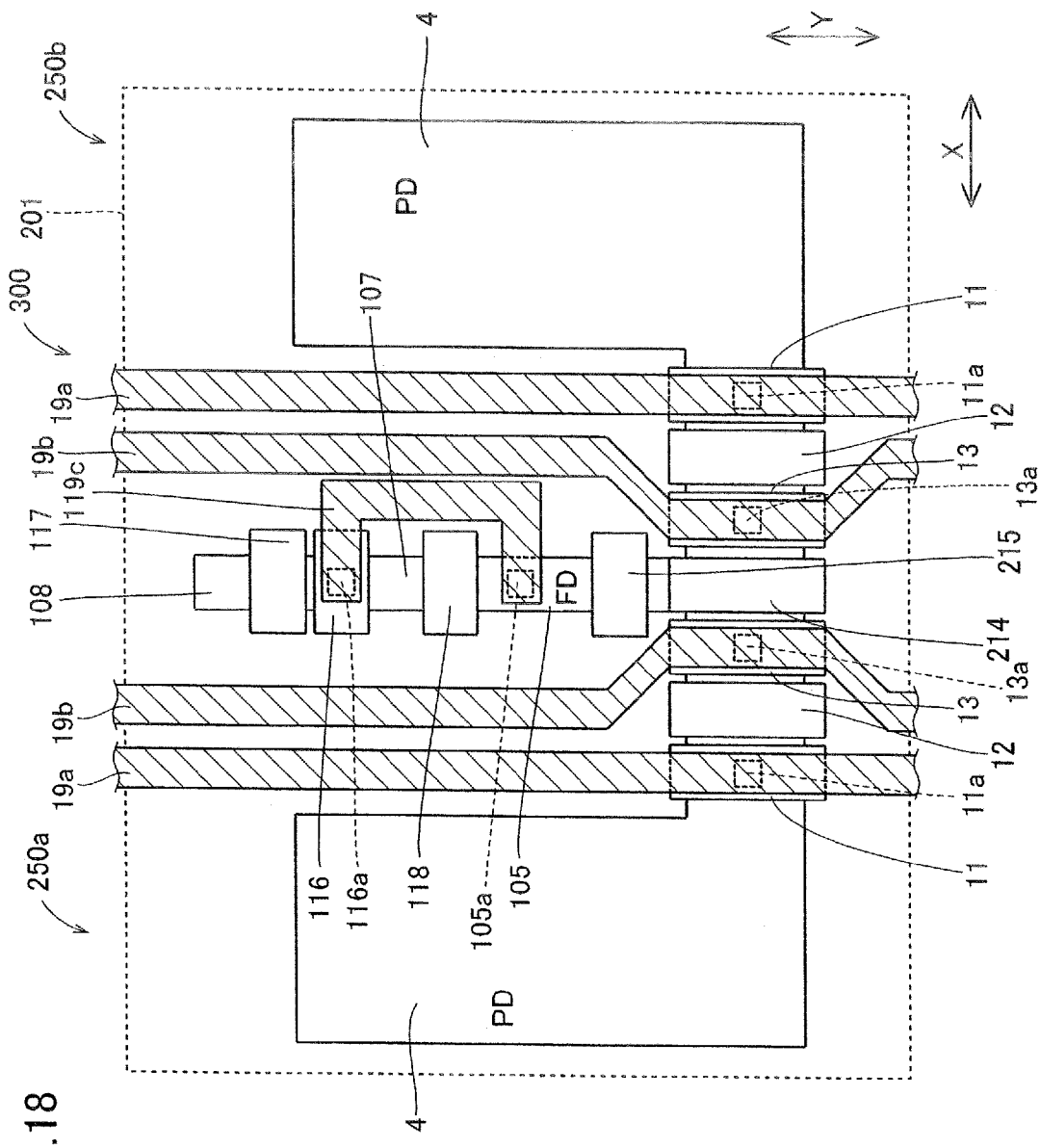
FIG. 18 is a plan view showing a first wiring layer of the CMOS image sensor according to the third embodiment.

According to the third embodiment, a first wiring layer is formed on the upper surface of a p-type silicon substrate 201 through an interlayer dielectric film (not shown). As shown in FIG. 18, wires 19a, 19b and 119c consist of the first wiring layer.

Figure 19:
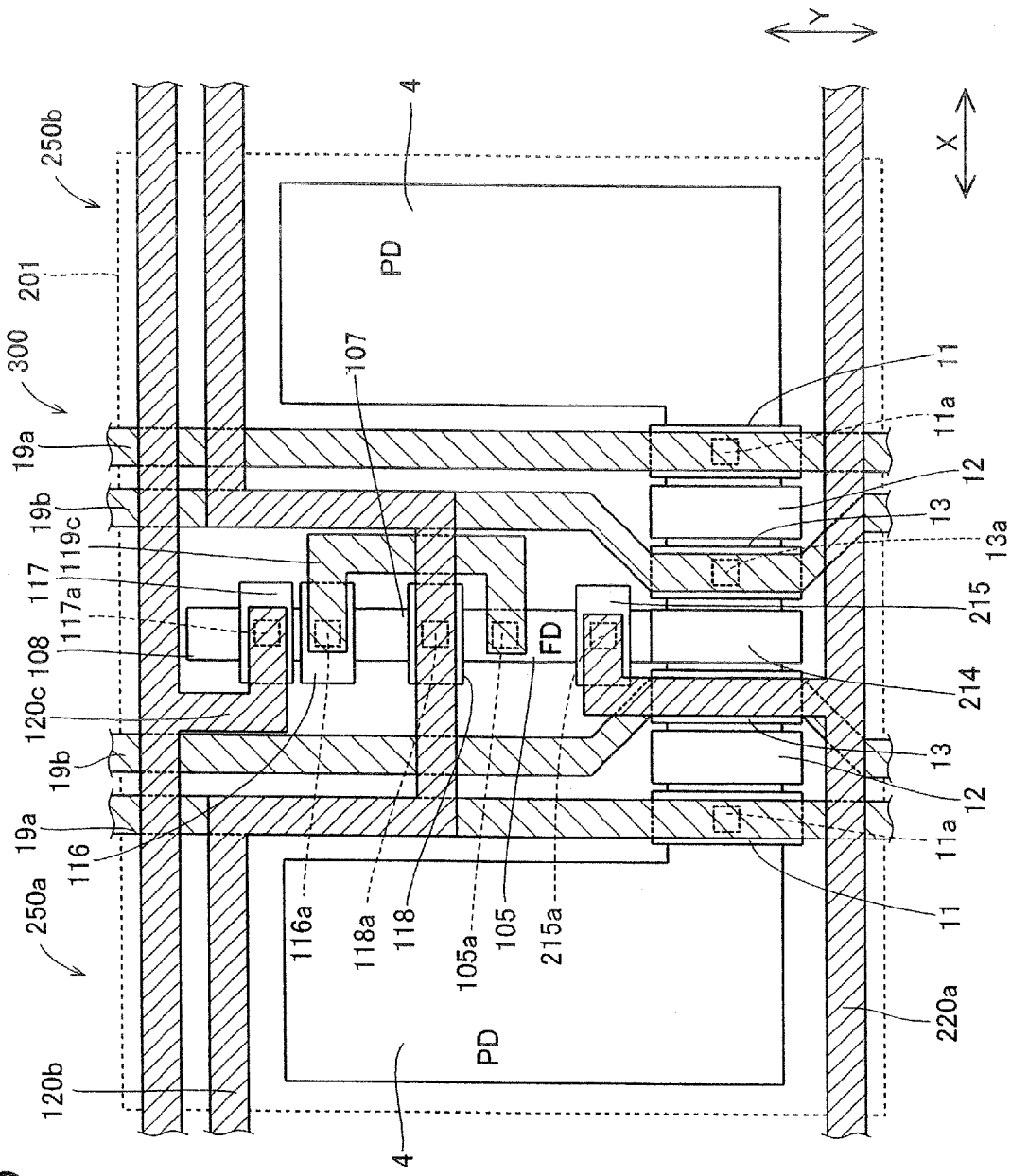
FIG. 19 is a plan view showing the first wiring layer and a second wiring layer of the CMOS image sensor according to the third embodiment.

According to the third embodiment, a second wiring layer is formed on the upper surface of the first wiring layer through another interlayer dielectric film (not shown). As shown in FIG. 19, a read gate line 220a, a reset gate line 120b and a row selection line 120c consist of the second wiring layer. Te read gate line 220a is an example of the "third wire" in the present invention. The read gate line 220a is connected to the read gate electrode 215 through a contact portion 215a. The remaining structure of the read gate line 220a is similar to that of the read gate line 20a of the CMOS image sensor 100 according to the aforementioned first embodiment.

Figure 20:
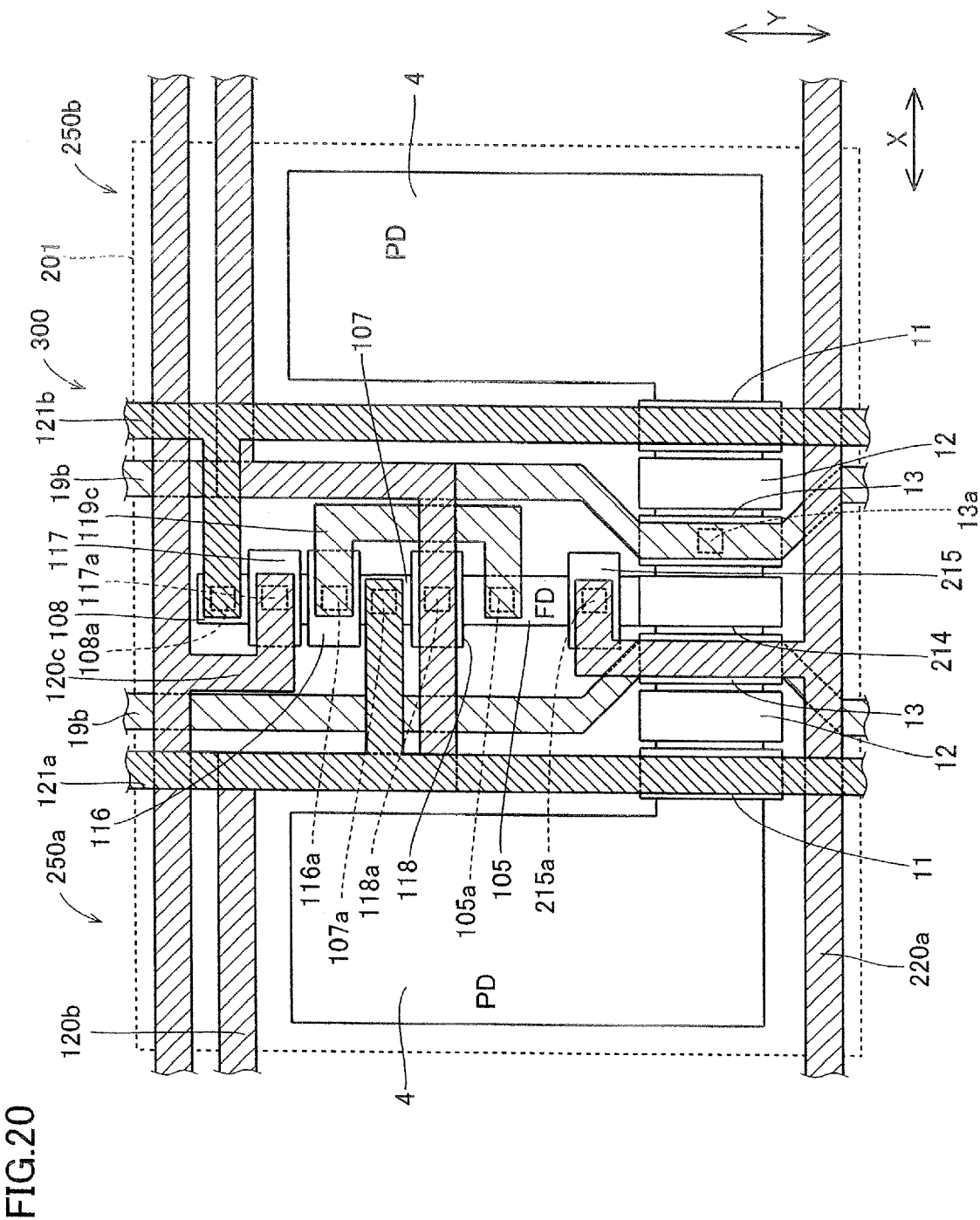
FIG. 20 is a plan view showing the first and second wiring layers and a third wiring layer of the CMOS image sensor according to the third embodiment.

According to the third embodiment, a third wiring layer is formed on the upper surface of the second wiring layer through still another interlayer dielectric film (not shown). As shown in FIG. 20, a VDD line 121a and a signal line 121b consist of the third wiring layer.

According to the third embodiment, a fourth wiring layer is formed on the upper surface of the third wiring layer through a further interlayer dielectric film (not shown). As shown in FIG. 17, wires 222a and 22b consist of the fourth wiring layer. The wire 222a is an example of the "second wire" in the present invention. The wire 222a is connected to the multiplier gate electrode 214 through a contact portion 214a. The remaining structures of the wires 222a and 22b are similar to those of the wires 22a and 22b of the CMOS image sensor 100 according to the aforementioned first embodiment.

The remaining structure of the third embodiment is similar to that of the aforementioned second embodiment.

According to the third embodiment, as hereinabove described, the two pixels 250a and 250b adjacent to each other in the direction X share the multiplier gate electrode 214 and the read gate electrode 215 in addition to the floating diffusion region 105, whereby a photoreceiving area of a photodiode portion 4 in the CMOS image sensor 300 can be further increased.

The remaining effects of the third embodiment are similar to those of the aforementioned second embodiment.

Fourth Embodiment

Referring to FIGS. 21 to 24, a CMOS image sensor 400 according to a fourth embodiment of the present invention includes pixels 350 each provided with only one transfer gate electrode 313 between a photodiode portion 4 and a multiplier gate electrode 14, dissimilarly to the aforementioned first embodiment. The transfer gate electrode 313 is an example of the "first electrode" in the present invention.

The photodiode portion 4 of the CMOS image sensor 400 according to the fourth embodiment also functions as a temporary storage well.

Figure 22:
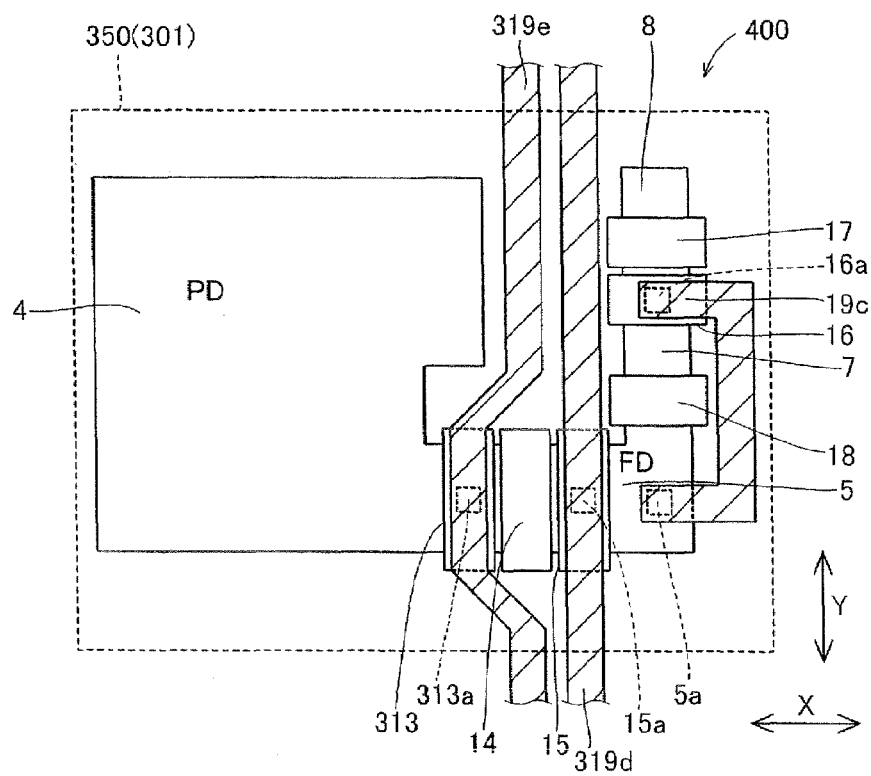
FIG. 22 is a plan view showing a first wiring layer of the CMOS image sensor according to the fourth embodiment.

According to the fourth embodiment, a first wiring layer is formed on the upper surface of a p-type silicon substrate 301 through an interlayer dielectric film (not shown). As shown in FIG. 22, a read gate electrode 319d and wires 19c and 319e consist of the first wiring layer. The read gate line 319d and the wire 319e are examples of the "third wire" and the "first wire" in the present invention respectively. The read gate line 319d is so formed as to extend in a direction Y every column. The wire 319e is connected to the transfer gate electrode 313 through a contact portion 313a. The remaining structures of the read gate line 319d and the wire 319e are similar to those of the read gate line 20a and the wire 19b of the CMOS image sensor 100 according to the aforementioned first embodiment respectively.

Figure 21:
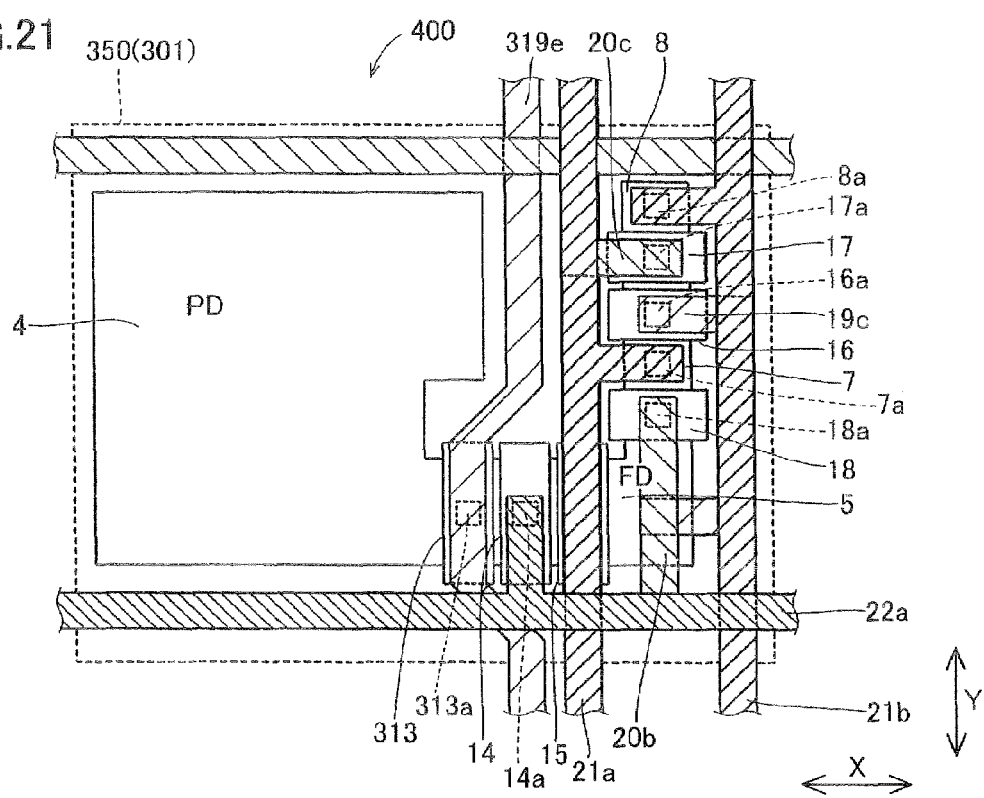
FIG. 21 is a plan view showing the structure of a CMOS image sensor according to a fourth embodiment of the present invention.
Figure 23:
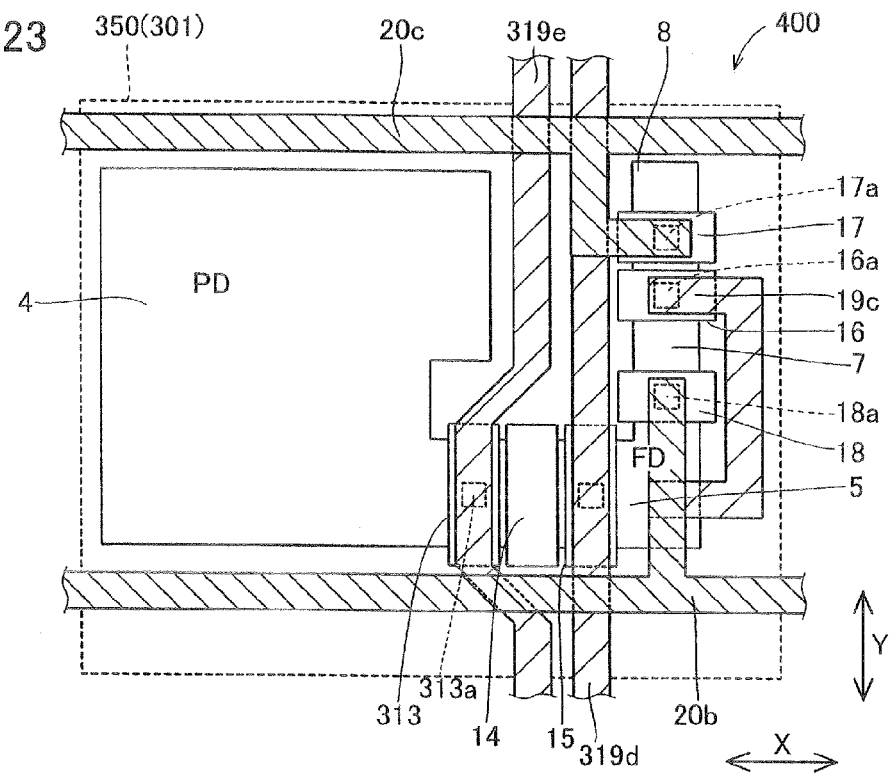
FIG. 23 is a plan view showing the first wiring layer and a second wiring layer of the CMOS image sensor according to the fourth embodiment.
Figure 24:
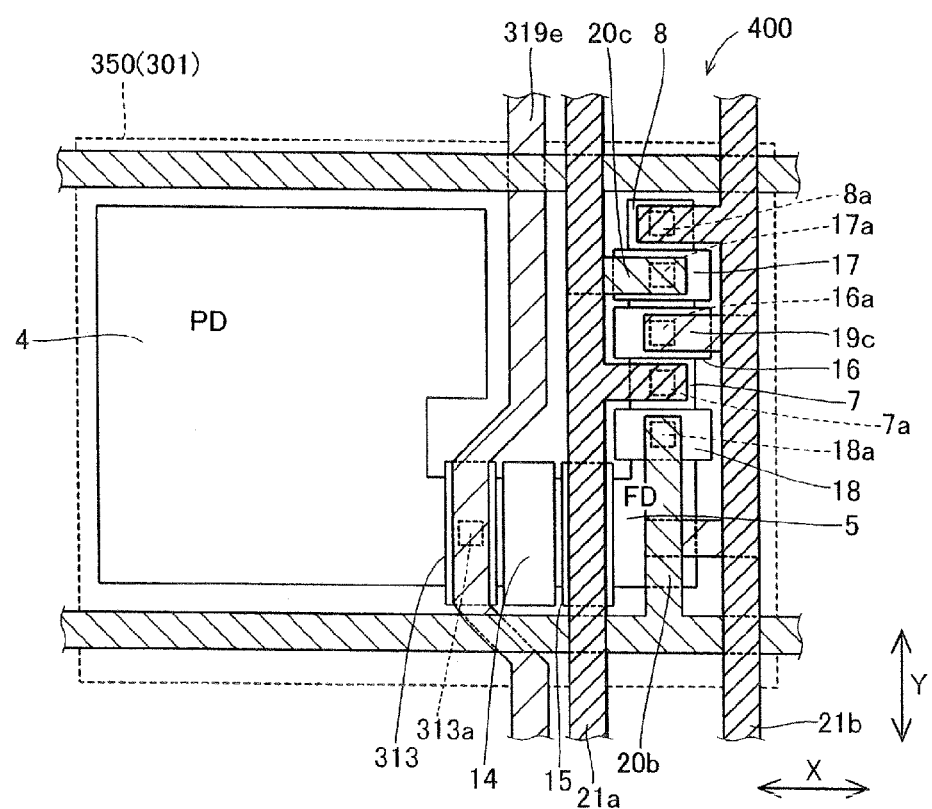
FIG. 24 is a plan view showing the first and second wiring layers and a third wiring layer of the CMOS image sensor according to the fourth embodiment.
Figure 25:
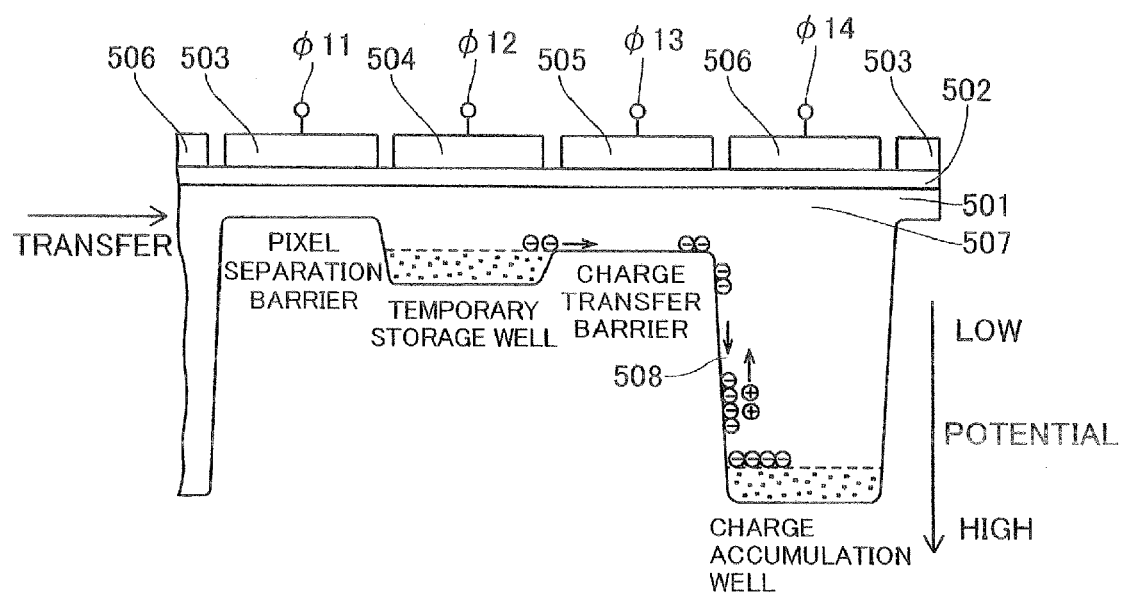
FIG. 25 is a sectional view showing the structure of a conventional multiplier CCD image sensor.

According to the fourth embodiment, a second wiring layer is formed on the upper surface of the first wiring layer through another interlayer dielectric film (not shown). As shown in FIG. 23, a reset gate line 20b and a row selection line 20c consist of the second wiring layer. A third wiring layer is formed on the upper surface of the second wiring layer through still another interlayer dielectric film (not shown). As shown in FIG. 24, a VDD line 21a and a signal line 21b consist of the third wiring layer. A fourth wiring layer is formed on the upper surface of the third wiring layer through a further interlayer dielectric film (not shown). As shown in FIG. 21, a wire 22a consists of the fourth wiring layer.

The remaining structure of the fourth embodiment is similar to that of the aforementioned first embodiment.

According to the fourth embodiment, as hereinabove described, only one transfer gate electrode 313 is formed between the photodiode portion 4 and the multiplier gate electrode 14, whereby the CMOS image sensor 400 can be downsized, and the area of the photodiode portion 4 in the CMOS image sensor 400 can be increased.

The remaining effects of the fourth embodiment are similar to those of the aforementioned first and second embodiments.

Although the present invention has been described and illustrated in detail, it is clearly understood that the same is by way of illustration and example only and is not to be taken by way of limitation, the spirit and scope of the present invention being limited only by the terms of the appended claims.

For example, while the photodiode portion 4 is formed in each of the aforementioned first to fourth embodiments, the present invention is not restricted to this but a transfer gate electrode for transferring electrons stored in the photodiode portion 4 may be formed on the upper surface of the photodiode portion 4.

While the transfer gate electrodes 11, 12 and 13 and the multiplier gate electrode 14 are formed in this order thereby arranging the photodiode portion 4, the photodiode separation barrier, the temporary storage well, the charge transfer barrier and the charge accumulation well in this order in each of the aforementioned first and second embodiments, the present invention is not restricted to this but the transfer gate electrode 11, the multiplier gate electrode 14 and the transfer gate electrodes 13 and 12 may alternatively be formed in this order thereby arranging the photodiode portion 4, the photodiode separation barrier, the charge accumulation well, the charge transfer barrier and the temporary storage well in this order.

While the high- or low-level clock signal φ3 is supplied to the transfer gate electrode 13 thereby regulating the portion of the transfer channel 3 located under the transfer gate electrode 13 to the potential of about 4 V or 1 V in each of the aforementioned first to third embodiments, the present invention is not restricted to this but a signal of a prescribed voltage may alternatively be supplied to the transfer gate electrode 13 thereby regulating the portion of the transfer channel 3 located under the transfer gate electrode 13 to a constant potential (about 2 V, for example).

While the wire 22b connected to the transfer gate electrode 12 and the wire 22a (222a) connected to the multiplier gate electrode 14 (214) are formed by the fourth wiring layer in each of the aforementioned first to third embodiments, the present invention is not restricted to this but the wire 22b connected to the transfer gate electrode 12 may alternatively be formed by a prescribed wiring layer other than the fourth wiring layer, so that only the wire 22a (222a) connected to the multiplier gate electrode 14 (214) is formed by the fourth wiring layer.

While the reset gate electrode is formed every pixel in each of the aforementioned first to fourth embodiments, the present invention is not restricted to this but the reset gate electrode may alternatively be formed every row or every column.

While the portions of the transfer channel 3 located under the transfer gate electrodes 11, 12 and 13 and the read gate electrode 15 respectively are regulated to the potentials of about 4 V when the transfer gate electrodes 11, 12 and 13 and the read gate electrode 15 are in ON-states in each of the aforementioned first and second embodiments, the present invention is not restricted to this but the portions of the transfer channel 3 located under the transfer gate electrodes 11, 12 and 13 and the read gate electrode 15 respectively may alternatively be regulated to potentials different from each other when the transfer gate electrodes 11, 12 and 13 and the read gate electrode 15 are in ON-states.

While the transfer channel, the photodiode portion, the floating diffusion region, the reset drain portion and the output portion are formed on the surface of the p-type silicon substrate in each of the aforementioned first to fourth embodiments, the present invention is not restricted to this but a p-type well region may alternatively formed on the surface of an n-type silicon substrate, so that the transfer channel, the photodiode portion, the floating diffusion region, the reset drain portion and the output portion are formed on the surface of this p-type well region.

While electrons are employed as charges in each of the aforementioned first to fourth embodiments, the present invention is not restricted to this but holes may alternatively be employed as charges by entirely reversing the conductivity type of the substrate impurity and the polarities of the applied voltages.

What is claimed is:

1. An image sensor comprising:
   a charge increasing portion for increasing the quantity of charges;
   a first electrode for applying a voltage regulating a region adjacent to said charge increasing portion to a prescribed potential;
   a second electrode provided adjacently to said first electrode for applying another voltage increasing the quantity of charges in said charge increasing portion;
   a first wire formed on a prescribed layer for supplying a signal to said first electrode;
   a second wire formed on a layer different from said prescribed layer for supplying another signal to said second electrode;
   a holding portion holding charges for outputting said charges as a signal; and
   a read electrode for applying still another voltage generating an electric field transferring charges to said holding portion.

2. The image sensor according to claim 1, wherein said first wire is so formed as to crossing overhead with said second wire.

3. The image sensor according to claim 1, further comprising:
   a storage portion for temporarily storing charges transferred to said charge increasing portion and transferring said stored charges, and
   a third electrode provided above a region provided with said storage portion for applying still another voltage generating an electric field necessary for storing charges in said storage portion.

4. The image sensor according to claim 3, further comprising a signal wire formed on the same layer as that provided with said second wire for supplying a further signal to said third electrode.

5. The image sensor according to claim 4, wherein said signal wire is so formed as to crossing overhead with said first wire.

6. The image sensor according to claim 4, further comprising:
   a third wire for supplying still another signal to said read electrode, and
   a signal line outputting said charges held in said holding portion as said signal, wherein
   said signal line is formed on a layer located between said layers provided with said second wire and said signal wire respectively and said layer provided with said third wire.

7. The image sensor according to claim 6, wherein said signal line is so formed as to intersect with said second wire, said third wire and said signal wire respectively.

8. The image sensor according to claim 3, further comprising:
   a photoelectric conversion portion generating charges, and
   a transfer electrode provided between said photoelectric conversion portion and said third electrode for transferring generated said charges to said storage portion.

9. The image sensor according to claim 8, further comprising a transfer wire formed on the same layer as that provided with said first wire for supplying a further signal to said transfer electrode.

10. The image sensor according to claim 9, wherein said transfer wire is so formed as to intersect with said second wire.

11. The image sensor according to claim 9, wherein said transfer wire is formed along the outer edge of said photoelectric conversion portion in a state not overlapping a region corresponding to said photoelectric conversion portion in plan view.

12. The image sensor according to claim 1, wherein at least said holding portion is shared by a plurality of pixels.

13. The image sensor according to claim 12, wherein said charge increasing portion, said second electrode and said read electrode are also shared by said plurality of pixels, in addition to said holding portion.

14. The image sensor according to claim 1, further comprising:
   a third wire formed on a layer different from said layer provided with said second wire for supplying still another signal to said read electrode.

15. The image sensor according to claim 14, wherein
said third wire is so formed as to crossing overhead with said second wire.

16. The image sensor according to claim 14, wherein
said third wire is formed on a layer located between said layer provided with said first wire and said layer provided with said second wire.

17. The image sensor according to claim 1, further comprising a plurality of pixels, wherein
said charge increasing portion, said first electrode and said second electrode are provided every said pixel.

18. The image sensor according to claim 1, wherein
said first wire is constituted as a first wiring layer, and
said second wire is constituted as a signal wiring layer.

19. The image sensor according to claim 18, wherein
said first wire consisting of said first wiring layer and said second wire consisting of said signal wiring layer are so formed as to crossing overhead with each other through a plurality of layers.

20. An image sensor comprising:
charge increasing means for increasing the quantity of charges;
a first electrode for applying a voltage regulating a region adjacent to said charge increasing means to a prescribed potential;
a second electrode provided adjacently to said first electrode for applying another voltage increasing the quantity of charges in said charge increasing means;
a first wire formed on a prescribed layer for supplying a signal to said first electrode;
a second wire formed on a layer different from said prescribed layer for supplying another signal to said second electrode;
a holding portion holding charges for outputting said charges as a signal; and
a read electrode for applying still another voltage generating an electric field transferring charges to said holding portion.

21. An image sensor comprising:
a charge increasing portion for increasing the quantity of charges;
a first electrode for applying a voltage regulating a region adjacent to said charge increasing portion to a prescribed potential;
a second electrode provided adjacently to said first electrode for applying another voltage increasing the quantity of charges in said charge increasing portion;
a first wire formed on a prescribed layer for supplying a signal to said first electrode; and
a second wire formed on a layer different from said prescribed layer for supplying another signal to said second electrode; wherein
said charge increasing portion, said first electrode and said second electrode are provided every pixel.

* * * * *